(12) United States Patent
Sirinorakul et al.

(10) Patent No.: US 8,063,470 B1
(45) Date of Patent: Nov. 22, 2011

(54) METHOD AND APPARATUS FOR NO LEAD SEMICONDUCTOR PACKAGE

(75) Inventors: Saravuth Sirinorakul, Bangkok (TH); Somchai Nondhasitthichai, Bangkok (TH)

(73) Assignee: Utac Thai Limited, Bangkok (TH)

( * ) Notice: Subject to any disclaimer, the term of this patent is extended or adjusted under 35 U.S.C. 154(b) by 445 days.

(21) Appl. No.: 12/154,483

(22) Filed: May 22, 2008

(51) Int. Cl.
*H01L 23/495* (2006.01)

(52) U.S. Cl. ........ 257/666; 257/670; 257/676; 257/690; 257/E23.031; 257/E23.034; 257/E23.061; 257/E23.124

(58) Field of Classification Search .............. 257/666, 257/670, 676, 690, E23.031, E23.034, E23.061, 257/E23.124
See application file for complete search history.

(56) References Cited

U.S. PATENT DOCUMENTS

| | | | |
|---|---|---|---|
| 3,391,383 A | 7/1968 | Antes | |
| 3,611,061 A | 10/1971 | Segerson | 317/234 R |
| 4,411,719 A | 10/1983 | Lindberg | 156/64 |
| 4,501,960 A | 2/1985 | Jouvet et al. | |
| 4,713,611 A | 12/1987 | Solstad et al. | |
| 4,757,255 A | 7/1988 | Margozzi | |
| 4,766,371 A | 8/1988 | Moriya | |
| 4,779,047 A | 10/1988 | Solstad et al. | |
| 4,801,561 A | 1/1989 | Sankhagowit | 437/207 |
| 4,855,672 A | 8/1989 | Shreeve | 324/158 R |
| 4,871,965 A | 10/1989 | Elbert et al. | |
| 5,006,792 A | 4/1991 | Malhi et al. | |
| 5,008,615 A | 4/1991 | Littlebury | |
| 5,142,449 A | 8/1992 | Littlebury et al. | |
| 5,247,248 A | 9/1993 | Fukunaga | 324/158 |
| 5,248,075 A | 9/1993 | Young et al. | 228/5.1 |
| 5,396,185 A | 3/1995 | Honma et al. | 324/754 |
| 5,397,921 A | 3/1995 | Karnezos | |
| 5,479,105 A | 12/1995 | Kim et al. | 324/755 |
| 5,535,101 A | 7/1996 | Miles et al. | |
| 5,548,884 A | 8/1996 | Kim | |
| 5,578,919 A | 11/1996 | Semba et al. | |
| 5,596,231 A | 1/1997 | Combs | |
| 5,666,064 A | 9/1997 | Kasai et al. | |
| 5,843,808 A | 12/1998 | Karnezos | |
| 5,990,692 A | 11/1999 | Jeong et al. | 324/755 |
| 6,072,239 A | 6/2000 | Yoneda et al. | 257/730 |
| 6,111,324 A | 8/2000 | Sheppard et al. | |
| 6,159,770 A | 12/2000 | Tetaka et al. | 438/112 |

(Continued)

OTHER PUBLICATIONS

U.S. Appl. No. 11/413,408, filed Apr. 27, 2006, Saruch Sangaunwong et al.
U.S. Appl. No. 12/080,676, filed Apr. 4, 2008, Saruch Sangaunwong et al.
U.S. Appl. No. 12/080,677, filed Apr. 4, 2008, Saruch Sangaunwong et al.
U.S. Appl. No. 12/290,188, filed Oct. 27, 2008, Saravuth Sirinorakul et al.
U.S. Appl. No. 60/001,961, filed Nov. 5, 2007, Saravuth Sirinorakul et al.
Notice of Allowance dated Dec. 2, 2009, U.S. Appl. No. 12/080,677, filed Apr. 4, 2008, Saruch Sangaunwong.

(Continued)

*Primary Examiner* — Eugene Lee
*Assistant Examiner* — Peniel M Gumedzoe
(74) *Attorney, Agent, or Firm* — Haverstock & Owens LLP

(57) ABSTRACT

A leadframe for use in fabricating a no lead semiconductor package contains connecting bars between individual electrical contact pads. For embodiments having a die pad, the leadframe further includes connecting bars between the contact pads and the die pad. The lower surfaces of the connecting bars are coplanar with the lower surfaces of the contact pads and/or the die pad, and the upper surfaces of the connecting bars are recessed with respect to the upper surfaces of the contact pads and/or the die pad. The semiconductor package is fabricated by encapsulating the die and the leadframe in a molding compound and then removing the connecting bars. The leadframe is typically formed by half etching a metal sheet to form the connecting bars. The connecting bars are removed from the encapsulated package by a selected cutting, sawing, or etching means, based on a predetermined pattern.

16 Claims, 20 Drawing Sheets

U.S. PATENT DOCUMENTS

| | | | |
|---|---|---|---|
| 6,229,200 B1 | 5/2001 | McLellan et al. | |
| 6,229,325 B1 | 5/2001 | Browning et al. | |
| 6,242,281 B1 | 6/2001 | McLellan et al. | |
| 6,284,569 B1 | 9/2001 | Sheppard et al. | |
| 6,285,075 B1 | 9/2001 | Combs et al. | |
| 6,294,100 B1 | 9/2001 | Fan et al. | |
| 6,304,000 B1 | 10/2001 | Isshiki et al. | 257/782 |
| 6,326,678 B1 | 12/2001 | Karnezos et al. | |
| 6,329,711 B1 | 12/2001 | Kawahara et al. | 257/698 |
| 6,353,263 B1 | 3/2002 | Dotta et al. | |
| 6,376,921 B1 | 4/2002 | Yoneda et al. | 257/787 |
| 6,392,427 B1 | 5/2002 | Yang | 324/755 |
| 6,414,385 B1 | 7/2002 | Huang et al. | 257/690 |
| 6,429,048 B1 | 8/2002 | McLellan et al. | |
| 6,451,709 B1 | 9/2002 | Hembree | 438/759 |
| 6,455,348 B1 | 9/2002 | Yamaguchi | |
| 6,489,218 B1* | 12/2002 | Kim et al. | 438/460 |
| 6,498,099 B1* | 12/2002 | McLellan et al. | 438/689 |
| 6,507,116 B1 | 1/2003 | Caletka et al. | |
| 6,545,332 B2 | 4/2003 | Huang | |
| 6,545,347 B2 | 4/2003 | McClellan | |
| 6,552,417 B2 | 4/2003 | Combs | |
| 6,552,423 B2 | 4/2003 | Song et al. | |
| 6,552,560 B2 | 4/2003 | Melgaard et al. | |
| 6,566,740 B2 | 5/2003 | Yasunaga et al. | |
| 6,573,121 B2 | 6/2003 | Yoneda et al. | 438/106 |
| 6,585,905 B1 | 7/2003 | Fan et al. | |
| 6,586,834 B1 | 7/2003 | Sze et al. | |
| 6,635,957 B2 | 10/2003 | Kwan et al. | |
| 6,667,191 B1 | 12/2003 | McLellan et al. | |
| 6,686,667 B2 | 2/2004 | Chen et al. | |
| 6,703,696 B2 | 3/2004 | Ikenaga et al. | |
| 6,709,877 B2 | 3/2004 | Tsui et al. | |
| 6,724,071 B2 | 4/2004 | Combs | |
| 6,734,044 B1 | 5/2004 | Fan et al. | |
| 6,734,552 B2 | 5/2004 | Combs et al. | |
| 6,737,755 B1 | 5/2004 | McLellan et al. | |
| 6,764,880 B2 | 7/2004 | Wu et al. | |
| 6,781,242 B1 | 8/2004 | Fan et al. | |
| 6,790,710 B2 | 9/2004 | McLellan et al. | |
| 6,800,948 B1 | 10/2004 | Fan et al. | |
| 6,812,552 B2* | 11/2004 | Islam et al. | 257/666 |
| 6,818,472 B1 | 11/2004 | Fan et al. | |
| 6,818,978 B1 | 11/2004 | Fan | |
| 6,818,980 B1 | 11/2004 | Pedron, Jr. | |
| 6,821,817 B1 | 11/2004 | Thamby et al. | |
| 6,841,859 B1 | 1/2005 | Thamby et al. | |
| 6,872,661 B1 | 3/2005 | Kwan et al. | |
| 6,876,066 B2 | 4/2005 | Fee et al. | |
| 6,897,428 B2 | 5/2005 | Minamio et al. | |
| 6,903,304 B1 | 6/2005 | McLellan et al. | |
| 6,933,176 B1 | 8/2005 | Kirloskar et al. | |
| 6,933,594 B2 | 8/2005 | McLellan et al. | |
| 6,940,154 B2 | 9/2005 | Pedron et al. | |
| 6,946,324 B1 | 9/2005 | McLellan et al. | |
| 6,964,918 B1 | 11/2005 | Fan et al. | |
| 6,967,126 B2 | 11/2005 | Lee et al. | |
| 6,979,594 B1 | 12/2005 | Fan et al. | |
| 6,982,491 B1 | 1/2006 | Fan et al. | |
| 6,984,785 B1 | 1/2006 | Diao et al. | |
| 6,989,294 B1 | 1/2006 | McLellan et al. | |
| 6,995,460 B1 | 2/2006 | McLellan et al. | |
| 7,008,825 B1 | 3/2006 | Bancod et al. | 438/123 |
| 7,009,286 B1 | 3/2006 | Kirloskar et al. | |
| 7,015,072 B2 | 3/2006 | Combs et al. | |
| 7,049,177 B1* | 5/2006 | Fan et al. | 438/123 |
| 7,060,535 B1 | 6/2006 | Sirinorakul | |
| 7,071,545 B1 | 7/2006 | Patel et al. | |
| 7,081,403 B1 | 7/2006 | Kirloskar et al. | |
| 7,091,581 B1 | 8/2006 | McLellan et al. | |
| 7,101,210 B2 | 9/2006 | Lin et al. | |
| 7,102,210 B2 | 9/2006 | Ichikawa | |
| 7,205,178 B2 | 4/2007 | Shiu et al. | |
| 7,224,048 B1 | 5/2007 | McLellan et al. | |
| 7,226,811 B1 | 6/2007 | McLellan et al. | |
| 7,232,755 B1 | 6/2007 | McLellan et al. | |
| 7,247,526 B1 | 7/2007 | Fan et al. | 438/123 |
| 7,270,867 B1 | 9/2007 | Kwan et al. | |
| 7,271,032 B1 | 9/2007 | McLellan et al. | |
| 7,274,088 B2 | 9/2007 | Wu et al. | |
| 7,314,820 B2 | 1/2008 | Lin et al. | |
| 7,315,080 B1 | 1/2008 | Fan et al. | |
| 7,342,305 B1 | 3/2008 | Diao et al. | |
| 7,344,920 B1 | 3/2008 | Kirloskar et al. | |
| 7,348,663 B1 | 3/2008 | Kirloskar et al. | |
| 7,358,119 B2 | 4/2008 | McLellan et al. | |
| 7,371,610 B1 | 5/2008 | Fan et al. | |
| 7,372,151 B1 | 5/2008 | Fan et al. | |
| 7,381,588 B1 | 6/2008 | Patel et al. | |
| 7,399,658 B2 | 7/2008 | Shim et al. | |
| 7,408,251 B2 | 8/2008 | Hata et al. | |
| 7,411,289 B1 | 8/2008 | McLellan et al. | |
| 7,449,771 B1 | 11/2008 | Fan et al. | |
| 7,482,690 B1 | 1/2009 | Fan et al. | |
| 7,595,225 B1 | 9/2009 | Fan et al. | |
| 7,714,418 B2* | 5/2010 | Lim et al. | 257/670 |
| 2003/0006055 A1* | 1/2003 | Chien-Hung et al. | 174/52.1 |
| 2003/0045032 A1 | 3/2003 | Abe | |
| 2003/0071333 A1 | 4/2003 | Matsuzawa | |
| 2003/0143776 A1 | 7/2003 | Pedron, Jr. et al. | |
| 2003/0178719 A1 | 9/2003 | Combs et al. | |
| 2003/0201520 A1* | 10/2003 | Knapp et al. | 257/666 |
| 2003/0207498 A1 | 11/2003 | Islam et al. | |
| 2004/0014257 A1 | 1/2004 | Kim et al. | |
| 2004/0046237 A1 | 3/2004 | Abe et al. | |
| 2004/0046241 A1 | 3/2004 | Combs et al. | |
| 2004/0080025 A1 | 4/2004 | Kasahara et al. | |
| 2004/0110319 A1 | 6/2004 | Fukutomi et al. | |
| 2005/0003586 A1* | 1/2005 | Shimanuki et al. | 438/124 |
| 2005/0077613 A1 | 4/2005 | McLellan et al. | |
| 2006/0192295 A1 | 8/2006 | Lee et al. | |
| 2006/0223229 A1 | 10/2006 | Kirloskar et al. | |
| 2006/0223237 A1 | 10/2006 | Combs et al. | |
| 2006/0273433 A1 | 12/2006 | Itou et al. | |
| 2007/0001278 A1 | 1/2007 | Jeon et al. | |
| 2007/0200210 A1 | 8/2007 | Zhao et al. | |
| 2007/0235217 A1 | 10/2007 | Workman | |
| 2008/0048308 A1 | 2/2008 | Lam | |
| 2008/0150094 A1 | 6/2008 | Anderson | |

OTHER PUBLICATIONS

U.S. Appl. No. 11/899,189, Saravuth Sirinorakul et al.
U.S. Appl. No. 12/231,710, Saravuth Sirinorakul et al.
U.S. Appl. No. 12/287,174, Saravuth Sirinorakul et al.
U.S. Appl. No. 12/378,119, Somchai Nondhasitthichai et al.
U.S. Appl. No. 12/383,135, Somchai Nondhasitthichai et al.
U.S. Appl. No. 11/413,408, Saruch Sangaunwong et al.
U.S. Appl. No. 12/080,676, Saruch Sangaunwong et al.
U.S. Appl. No. 12/080,677, Saruch Sangaunwong et al.
U.S. Appl. No. 12/290,188, Saravuth Sirinorakul et al.
U.S. Appl. No. 11/788,496, filed May 19, 2007, Somchai Nondhasitthichai et al.
U.S. Appl. No. 11/731,522, filed Mar. 30, 2007, Saravuth Sirinorakul et al.
U.S. Appl. No. 12/002,054, filed Dec. 14, 2007, Somchai Nondhasitthichai et al.
U.S. Appl. No. 12/002,186, filed Dec. 14, 2007, Somchai Nondhasitthichai et al.
U.S. Appl. No. 12/002,187, filed Dec. 14, 2007, Somchai Nondhasitthichai et al.
Office Action dated Sep. 29, 2010, U.S. Appl. No. 12/838,252, filed Jul. 16, 2010, Saravuth Sirinorakul et al.
Office Action dated Feb. 1, 2011, U.S. Appl. No. 12/838,252, filed Jul. 16, 2010, Saravuth Sirinorakul et al.
Office Action dated Apr. 5, 2011, U.S. Appl. No. 12/838,252, filed Jul. 16, 2010, Saravuth Sirinorakul et al.
Michael Quirk and Julian Serda, Semiconductor Manufacturing Technology, Pearson Education International, Pearson Prentice Hall, 2001, p. 587-588.

* cited by examiner

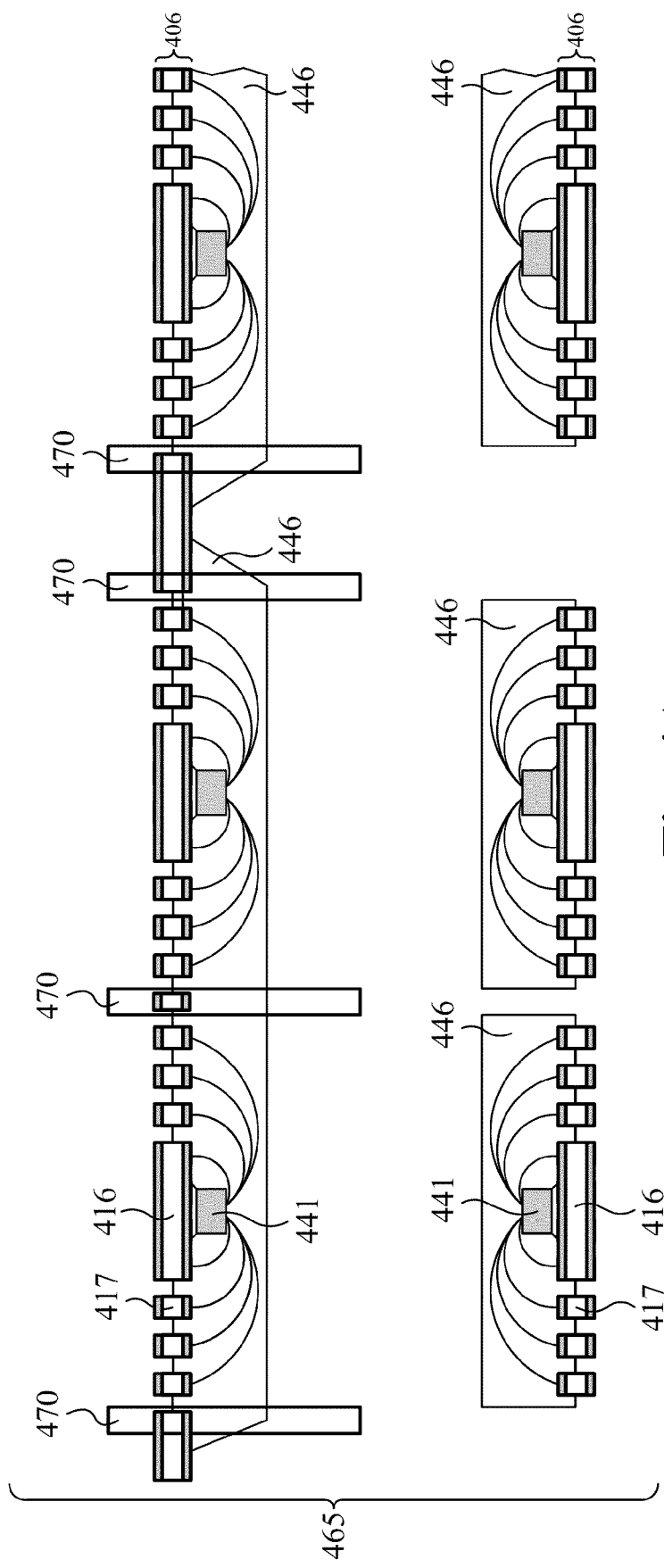

TOP　　　　　　　BOTTOM

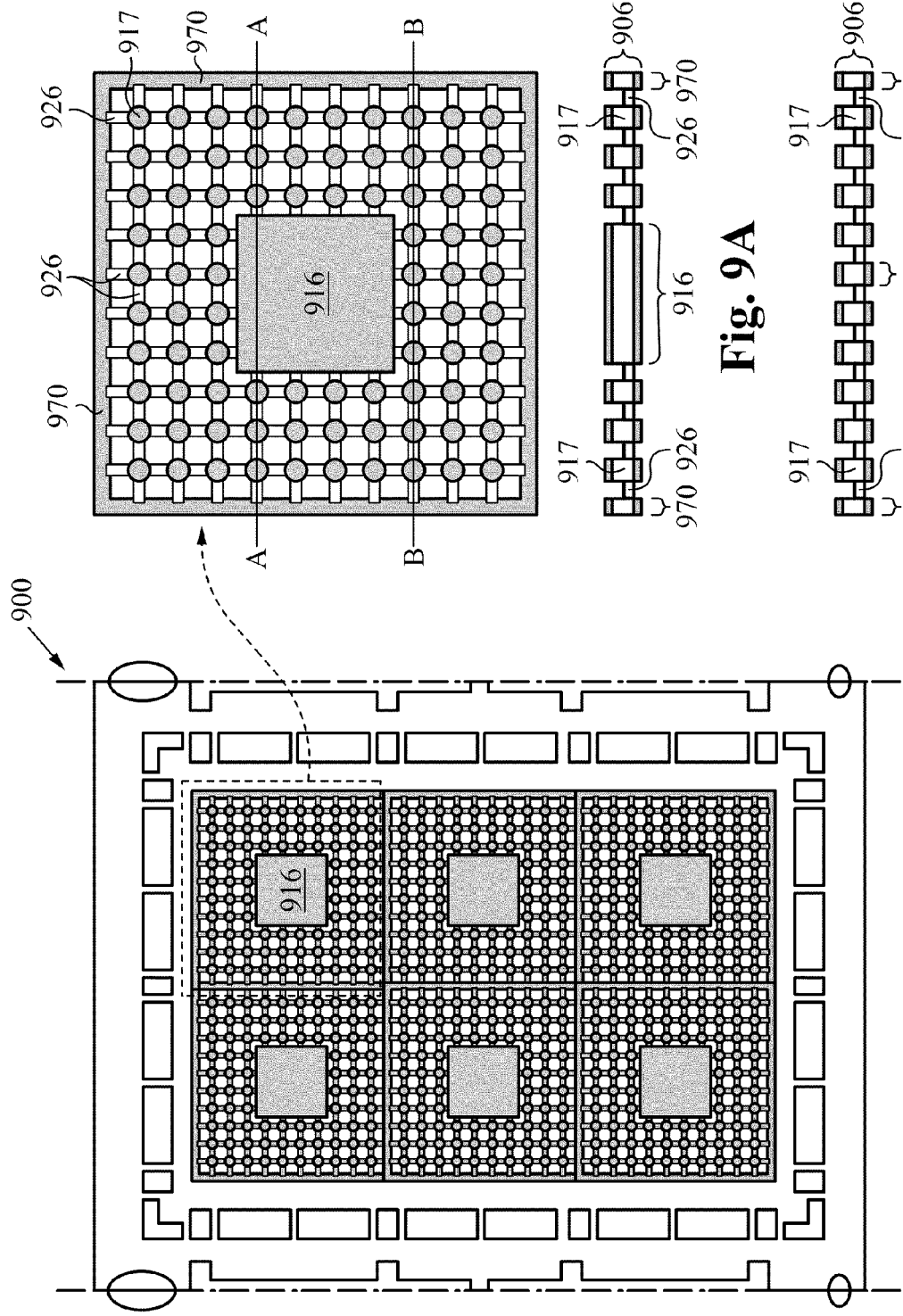

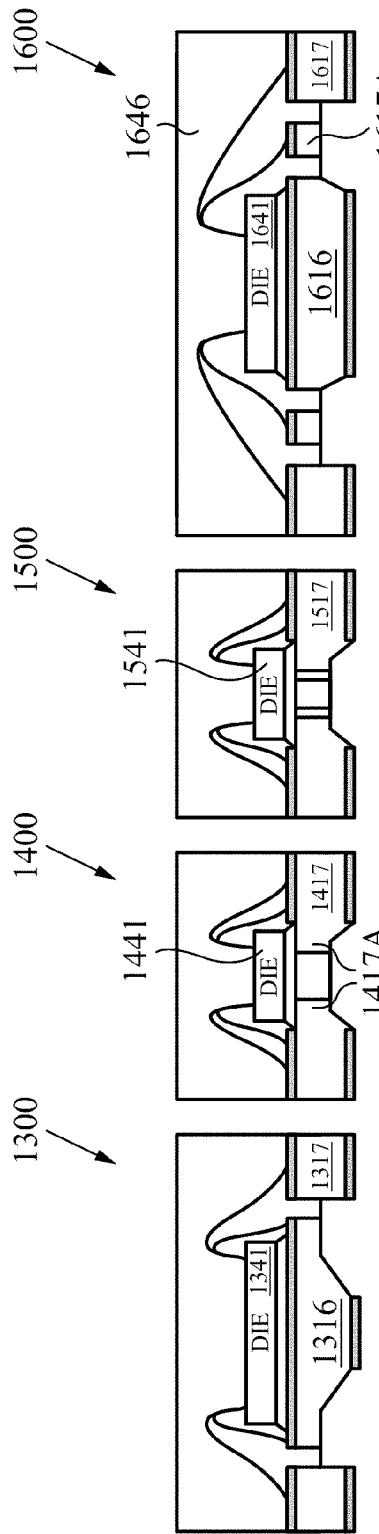
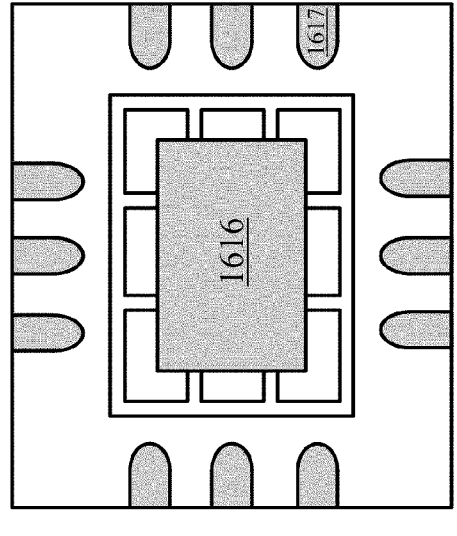
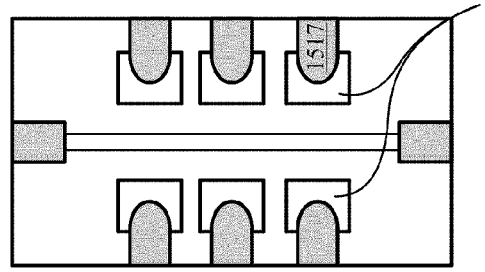
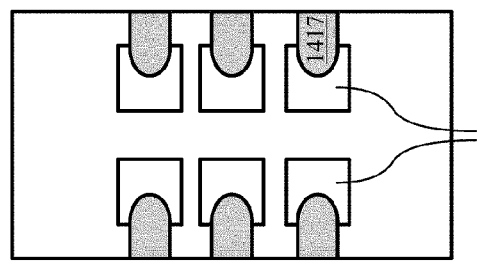
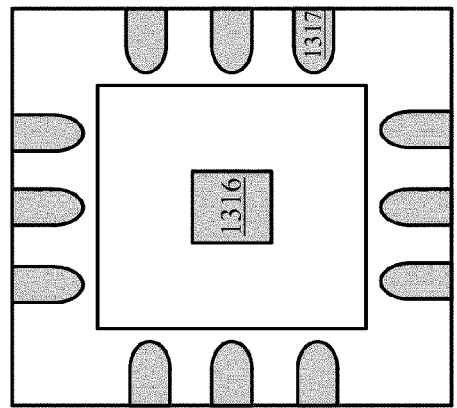

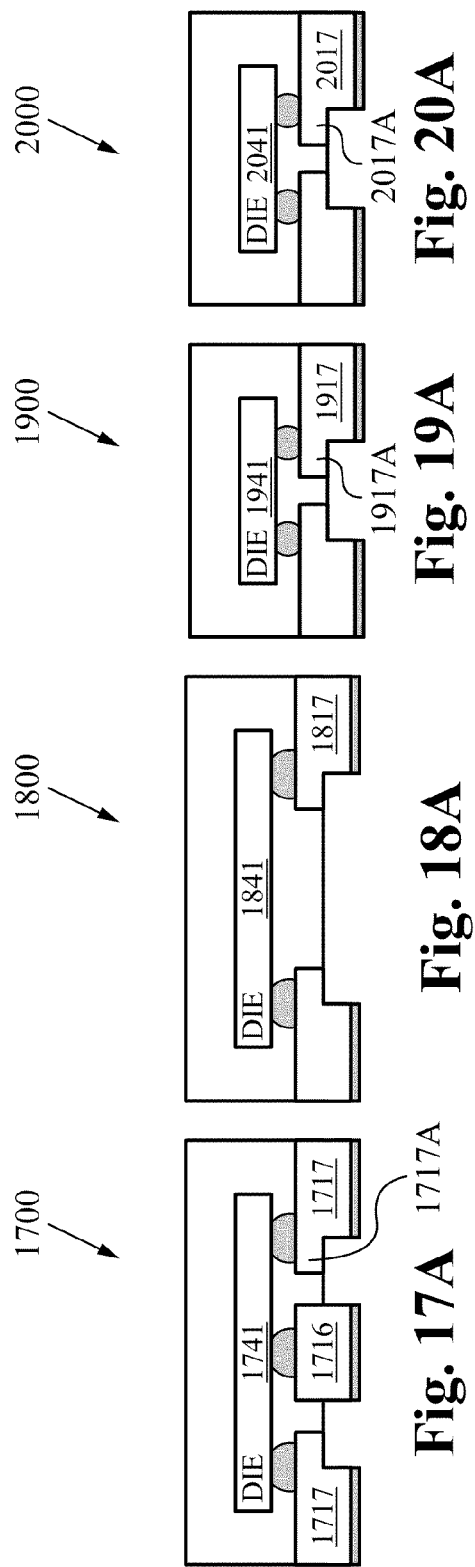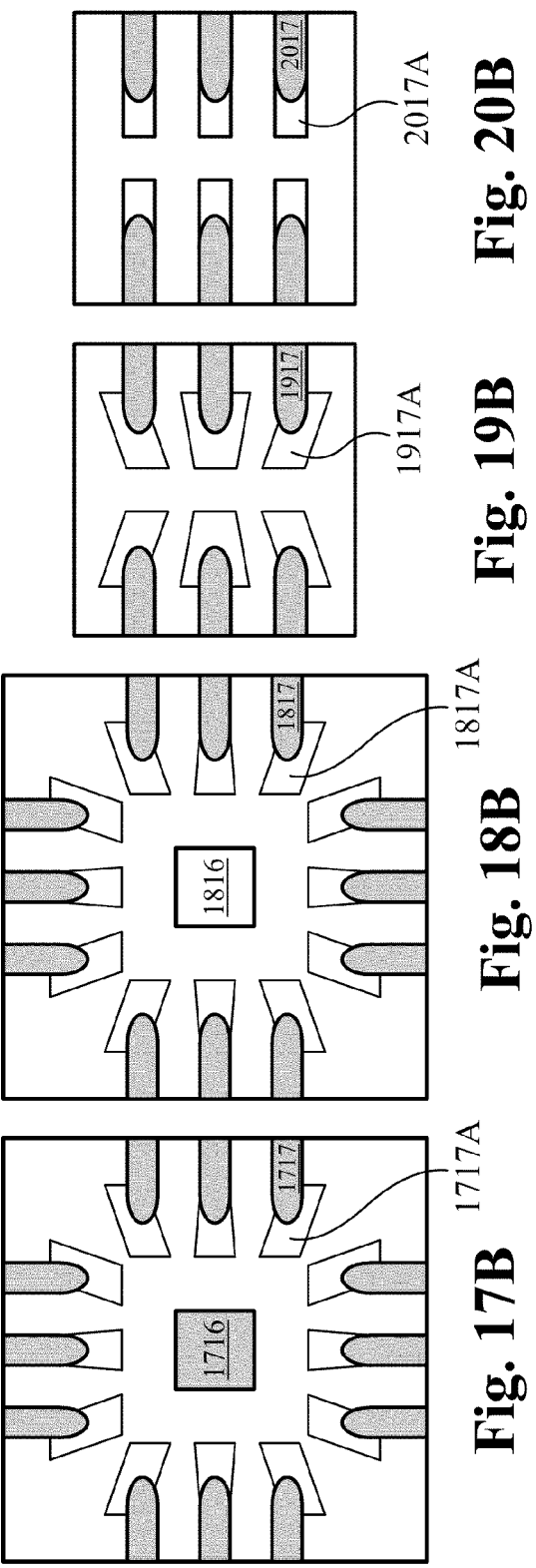

TOP BOTTOM

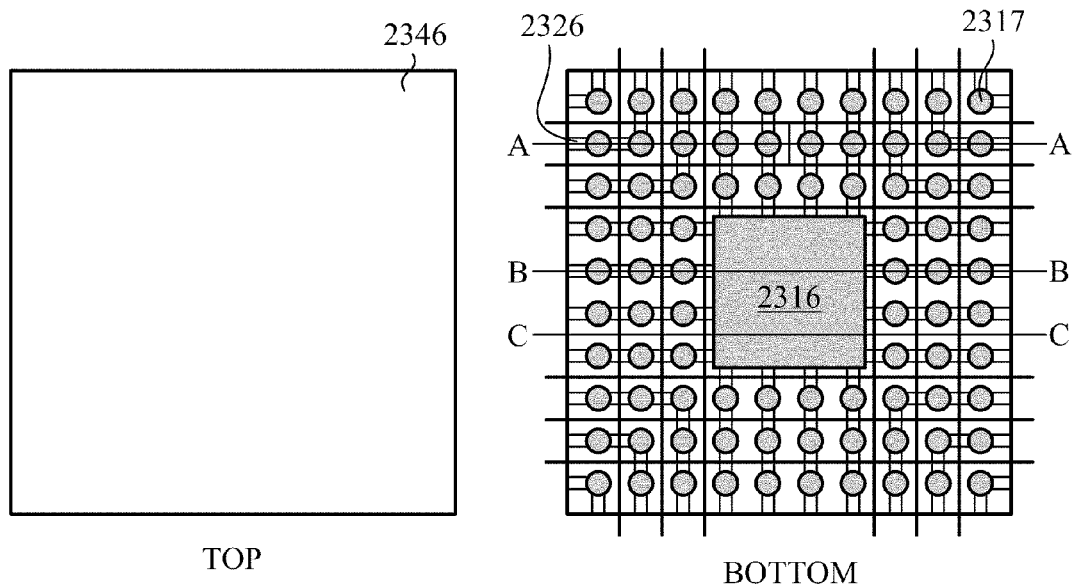
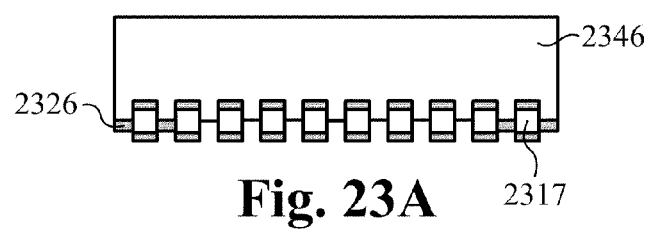
Fig. 23A
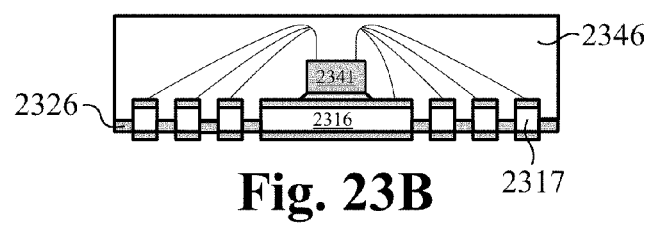
Fig. 23B
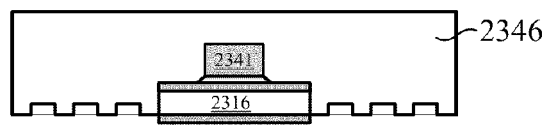
Fig. 23C

METHOD AND APPARATUS FOR NO LEAD SEMICONDUCTOR PACKAGE

FIELD OF THE INVENTION

The present invention relates to no lead semiconductor packages. More specifically, the present invention is related to method and apparatus for no lead semiconductor package.

BACKGROUND

A leaded semiconductor package typically has a semiconductor die encapsulated in molded plastic. The plastic encapsulation protects the die from physical damage as well as environmental effects, such as heat, light and/or electricity, for example. The leaded semiconductor package is typically mounted on a board, such as a printed circuit board (PCB), by means of metal leads that protrude from the encapsulation. The metal leads further provide electrical connections from the die to external circuitry that is typically located on the board. For instance, the metal leads are usually soldered or are otherwise electrically bonded to several bonding pads on the PCB.

As described below, so called "leadless" or "no lead" semiconductor packages have also been developed. Many of these semiconductor packages are mass produced by using sheets of leadframe arrays. Leadframes provide a design and preliminary framework for the die pad and/or contact pads of a semiconductor package. However, leadframe technology has had difficulties in forming multi row terminals for leadless packages. For instance, half etching is conventionally used to form leadframes, and to form the connecting bars between the parts of the leadframe, and between the leadframes, themselves. This method of manufacture is often referred to as etched leadframe technology. However, etched leadframes can pose problems during manufacture, particularly during the handling and wire bonding processes. These problems relate to the strength and structural integrity of the leadframes, and thus, have adverse effects on useful yield and quality of the manufactured product.

Accordingly, an additional plastic substrate, which is similar to a PCB, is conventionally used to provide additional strength and structure during manufacture, particularly for leadless packages having multiple rows of contact pads. However, the additional substrate undesirably adds cost, time delay, and other manufacturing problems.

SUMMARY OF THE INVENTION

Embodiments of the invention provide a leadless semiconductor package. A method of fabricating the semiconductor package includes a process for forming a leadframe. The leadframe includes several contact pads and/or a die pad. Preferably, the lead frame further includes one or more connecting bar(s) that are formed between two or more contact pads, between a contact pad and a die pad, and/or between a contact pad and/or a die pad and an exterior portion of the leadframe. The exterior portion of the leadframe is not typically part of the completed semiconductor package.

Specifically, some embodiments fabricate the lead frame by partially etching the top surface of a metal sheet to form the upper portions of the die pad, the contact pads, and/or the connecting bars of the leadframe. The bottom surface of the metal sheet is then etched to form the lower portions of the die pad, the contact pads, and the connecting bar(s). Before the surfaces of the metal sheet are etched, some embodiments apply a masking pattern to the surfaces of the metal sheet. The masking pattern typically covers the areas where the contact pads and/or the die pad of the leadframe are to be formed. In some embodiments, the masking pattern comprises a leadframe design. In some of these embodiments, the regions of the metal sheet for the connecting bar(s) are left unmasked or exposed to the etching process. Thus, in a leadframe of some embodiments, the etching process leaves the upper surfaces of the connecting bars recessed with respect to the upper surfaces of the die pad and/or contact pads, while the etching process in these, or in other embodiments, leaves the lower surfaces of the connecting bars coplanar with the lower surfaces of the die pad and/or contact pads.

After the leadframe has been fabricated, a semiconductor die is typically attached to the die pad and the die is wire bonded to one or more contact pad(s) and/or the die pad. Alternatively, the connections between the die and the contact pads and/or the die pad are formed in other ways. For example, in a "flip-chip" style package, the semiconductor die is inverted, with the terminals of the die facing the die pad and/or the contact pads, such that the die terminals are soldered directly to the die pad and/or the contact pads, for example, with solder balls.

After the electrical connections are formed between the semiconductor die and the die pad and/or the contact pads of the leadframe during wire bonding, the die and leadframe are encapsulated. Typically, encapsulation is performed by using a polymer molding compound. During the encapsulation process of some embodiments, the lower surfaces of the leadframe, including the die pad, contact pads, and/or one or more connecting bar(s) are attached to, or held against, a tape to prevent the molding compound from encapsulating the lower surfaces of the die pad, contact pads, and/or the connecting bars. However, the molding compound encapsulates the top surfaces of the leadframe and fills any areas between the components of the leadframe, such as the connecting bars, for example.

After the encapsulation process, the molding tends to hold the semiconductor package together. Thus, the connecting bars of some embodiments are no longer needed and are removed. The connecting bars of some of these embodiments are exposed at the bottom surface of the package. The removal of these connecting bars is performed by using various methods, such as, for example, chemical etching, and/or cutting with a laser or a saw blade. During this "isolation" step, one or more contact pad(s) are isolated by the etching, cutting and/or sawing. In some embodiments, the connecting bars are removed based on a specific pattern that is selected for the semiconductor package. In some embodiments, the means for removal of the connecting bars is also selected based on the selected pattern for the semiconductor package.

After the connecting bars are removed and/or the contact pads are isolated, the semiconductor packages are then singulated to separate individual semiconductor packages from the molded sheet of semiconductor packages. Singulation is typically performed by using a dicing saw to make cuts along the edges of the packages. In the singulation process, any connecting bars that run along the edges of the packages are severed.

BRIEF DESCRIPTION OF THE DRAWINGS

The novel features of the invention are set forth in the appended claims. However, for purpose of explanation, several embodiments of the invention are set forth in the following figures.

FIG. 4A illustrates an exemplary result produced by each step of the LGA process of FIG. 4.

FIG. 9 illustrates a close up view of a portion of the strip of leadframes illustrated in FIG. 8.

FIGS. 10A-B, 11A-B, 12A-B, 13A-B, 14A-B, 15A-B, 16A-B, and 24A-B illustrate exemplary wire bond style semiconductor packages that are manufactured according to some embodiments of the invention.

FIGS. 17A-B, 18A-B, 19A-B, and 20A-B illustrate exemplary flip chip style packages manufactured according to some embodiments of the invention.

FIG. 23 illustrates possible paths of a saw blade to remove a set of connecting bars to separate the contact pads in the array of the leadframe illustrated in FIG. 21.

DETAILED DESCRIPTION

Figure 1:
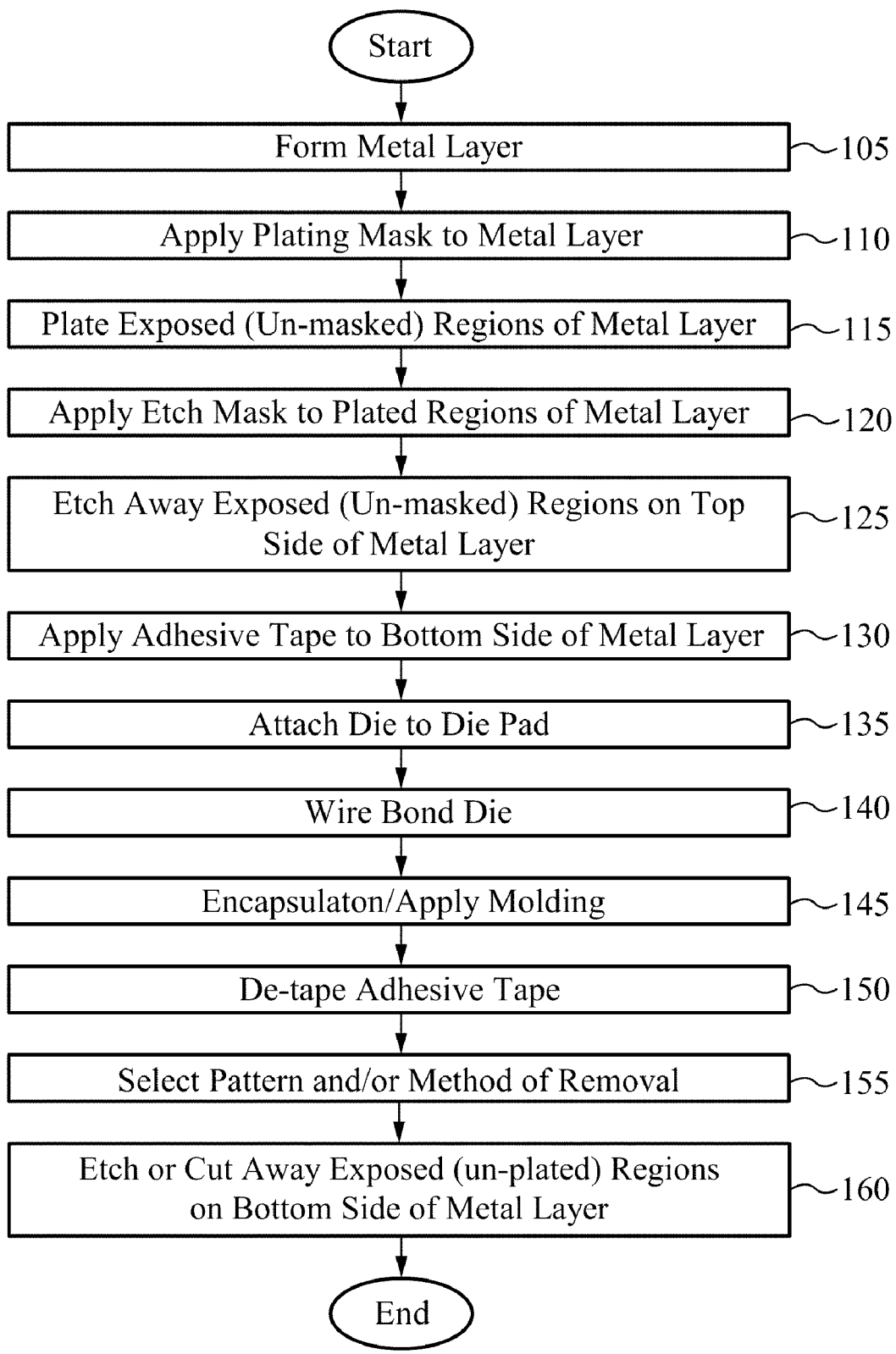
FIG. 1 illustrates a pre-tape process for semiconductor package fabrication.

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

I. Overview of No Lead Packages

A "no lead" or leadless package typically contains a semiconductor die, a die pad, several bonding wires, and metal contacts or leads. The die pad and metal contacts are typically provided by a leadframe. The die is preferably bonded to the die pad by using an adhesive, such as, for example, an epoxy. Additionally, the bond wires typically couple the die to one or more of the metal contacts. The die is often contacted electrically through the bonding wires and/or the die pad. The die, die pad, and bonding wires are encapsulated by using a plastic molding compound. In contrast to a leaded package, the metal contacts in a leadless package typically do not extend beyond the dimensions of the package. However, the metal contacts typically are only partially encapsulated. Partial encapsulation leaves a portion, for example, a bottom side of the metal contacts exposed. Some no lead packages also have the bottom side of the die pad exposed. The no lead package is usually mounted on a board such as a PCB, with the exposed surfaces of the metal contacts and/or die pad soldered to the bonding pads on the PCB. Thus in a no lead package such as, for example, a quad flat no lead (QFN) package, the metal leads are generally nearly flush with a surface of the encapsulation. Another type of no lead package known in the industry is the dual flat no lead (DFN) package.

The no lead packages described above are sometimes manufactured by attaching a plurality of dies to several corresponding die pads in one or more leadframes on a metal sheet. In some instances, the metal contacts and the die pad of each leadframe are connected by an array of connecting bars. The leadframe is often attached to a tape. The tape is typically an adhesive tape that temporarily provides the die pad, metal contacts, and lead frame temporary support during wire bonding. The tape provides support in conjunction with, or instead of, the connecting bars. After the electrical connections have been made between the die and the metal contacts during wire bonding or otherwise, the die(s) and die pad(s) are then encapsulated in a plastic molding compound and the tape is removed. The connecting bars are also removed. In some embodiments, the connecting bars are severed by a novel process involving a laser and/or a blade saw. Preferably, the connecting bars are removed in specific patterns, for example, to isolate specific contact pads and/or one or more die pad(s) in particular configurations.

Once the contact pads and/or die pad(s) are isolated in the desired configurations, the encapsulated packages are separated from the molded sheet or molded strip of dies and/or leadframes by a singulation process to produce individual manufactured semiconductor packages. Various methods of manufacturing no lead packages are described in Section II. The products of some of these methods are described in Section III.

II. Method of Fabrication

A. The Pre-Tape Process

Figure 1A:
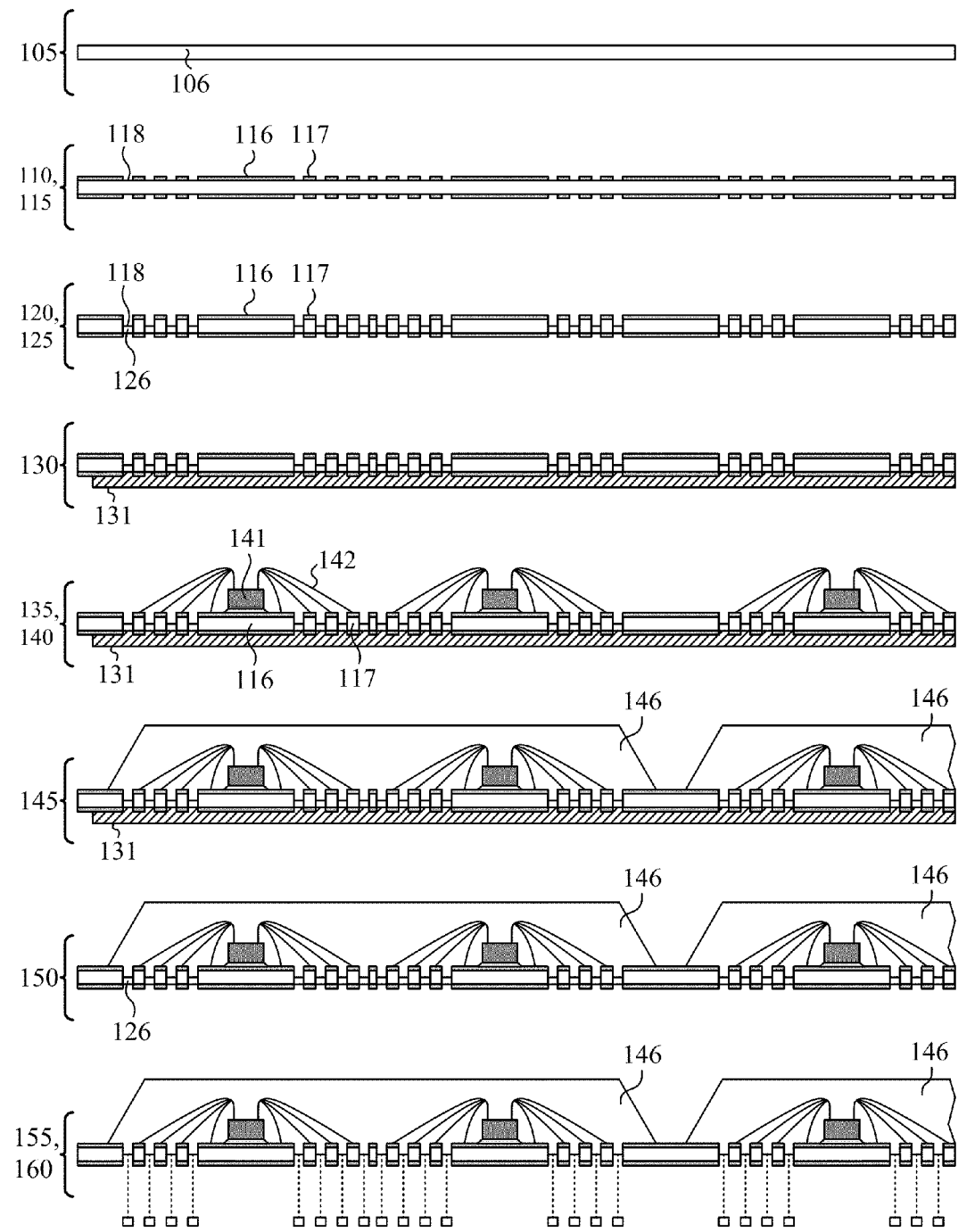
FIG. 1A illustrates an exemplary result produced by each step of the pre-tape process of FIG. 1.

FIG. 1 illustrates semiconductor package fabrication with a pre-tape process 100. As shown in this figure, the pre-tape process 100 begins at the step 105, where a metal layer is formed. Preferably, the metal layer is formed from a sheet of bare copper or some other metal, such as Alloy 42. For instance, FIG. 1A illustrates a metal layer 106, formed by the step 105 illustrated in FIG. 1.

Then, as shown in FIG. 1, the pre-tape process 100 transitions to the step 110, where a plating-mask is applied to the metal layer. The plating mask typically comprises a leadframe design that is formed using a photo resist pattern. Leadframe designs are discussed further in Section III. The photo resist pattern covers areas of the metal layer that are not to be plated, for example, the areas between a die pad and several contact pads of a leadframe, and the areas on the metal layer that are between lead frames. Once the plating mask is applied to the metal layer at the step 110, the pre-tape process transitions to the step 115.

At the step 115, the exposed or unmasked regions of the metal layer are plated. In some embodiments, the plating comprises nickel (Ni), palladium (PD), and gold (Au). However, one of ordinary skill will recognize other platings, such as, for example, Ni/Pd/Au-alloy, Ni/Au, or Ni/Au-alloy. As mentioned above, the plating binds to the areas of the metal layer that are not covered by the plating mask to yield a plated leadframe design on the metal layer. For instance, FIG. 1A illustrates the metal layer 106, having the plated regions 116, 117 and an unplated masked region 118. Specifically, the plated region 116 forms a die pad, while the plated region 117 forms a contact pad of a leadframe. The unplated regions 118 are then typically used to form the connecting bars of some embodiments. As shown in FIG. 1, once the metal layer is plated at the step 115, the pre-tape process transitions to the step 120.

At the step 120, an etch mask is applied to the plated regions of the metal layer. The etch mask is typically a photo resist material that prevents the leadframe design formed above (at the step 115) from being etched away at the step 125.

At the step 125, the exposed (unmasked) regions on a top side of the metal layer are etched away to yield connecting bars between the components of the leadframe, such as the die pad and the contact pads, formed above (at the step 115). Some embodiments employ a cupric chloride etchant to etch away a top portion of the metal layer between the die pad and the contact pads. These embodiments form a connecting bar between the die pad and the contact pads of the leadframe. For instance, FIG. 1A illustrates the metal layer 106 with a connecting bar 126 formed by etching the unmasked region between the die pad 116 and the contact pad 117. As shown in this figure, a top surface of the connecting bar 126 is recessed with respect to the top surfaces of the die pad 116 and the contact pad 117. Thus, the connecting bar 126 is referred to as half-etched, in some embodiments. After the metal layer 106 is half etched to yield the connecting bar 126, the pre-tape process transitions to the step 130, illustrated in FIG. 1.

At the step 130 of the pre-tape process 100, an adhesive tape 131 is applied to the bottom side of the metal layer 106. Some embodiments employ a polyimide tape in conjunction with an adhesive. The adhesive is either silicone, or a thermoset polymer, such as an acrylic thermoset polymer, in these embodiments. For instance, FIG. 1A illustrates an adhesive tape 131 pre-taped or adhered to the bottom side of the metal layer 106, by using the adhesive.

Then, as shown by the steps 135 and 140 of FIGS. 1 and 1A, a die 141 is attached to the die pad 116, and the die 141 is wire bonded 142 to the die pad 116 and/or the contact pad(s) 117 of the lead frame.

Next, at the step 145, an overmolding 146 is applied to encapsulate the die 141, wire bond(s) 142, and other portions of the leadframe. At the step 150, the adhesive tape 131 is typically removed by using a de-taping procedure. As shown in FIG. 1A, the de-taping procedure exposes the unencapsulated bottom side of the metal layer 106, particularly the bottom sides of the plated leadframe and the connecting bar(s) 126.

At the step 155, of some embodiments, a pattern for removal of the connecting bars and/or isolation of the contact pads is selected. Further, a method of removal is selected at the step 155 of some embodiments. Then, the process 100 of FIG. 1 transitions to the step 160, where the exposed (unplated) regions on a bottom side of the metal layer 106 (of FIG. 1A), particularly the connecting bars 126, are removed. Some embodiments remove the connecting bars in specific patterns, for instance, to isolate the contact pads based on the pattern selected at the step 155. Further, some embodiments employ the method of removal selected at the step 155. For instance, the metal layer 106 (of FIG. 1A), and thus, the connecting bars 126 typically comprise unplated bare copper. Hence, the connecting bars 126 are etched away in the embodiments that select and use an alkaline-type chemical etchant, such as, for example, ammonium hydroxide or ammonium chloride. The chemical etchant of these embodiments are specific to copper and do not significantly affect the regions of the metal layer 106, that are plated by using nickel, palladium, gold, and/or various alloys, for example.

Moreover, the connecting bars 126 of some embodiments are removed differently, for example, by using laser etching and/or blade sawing. These embodiments are further described in Section IV. Regardless of how the connecting bars 126 are removed, the plated die pad 116 and contact pads 117 of the leadframe are typically exposed, and can even protrude from the plastic molding 146, at the bottom side of the encapsulated package, as shown in FIG. 1A. Then, the pre-tape process 100 concludes.

B. The No Pre-Tape or the "Tape Assist" Process

Figure 2:
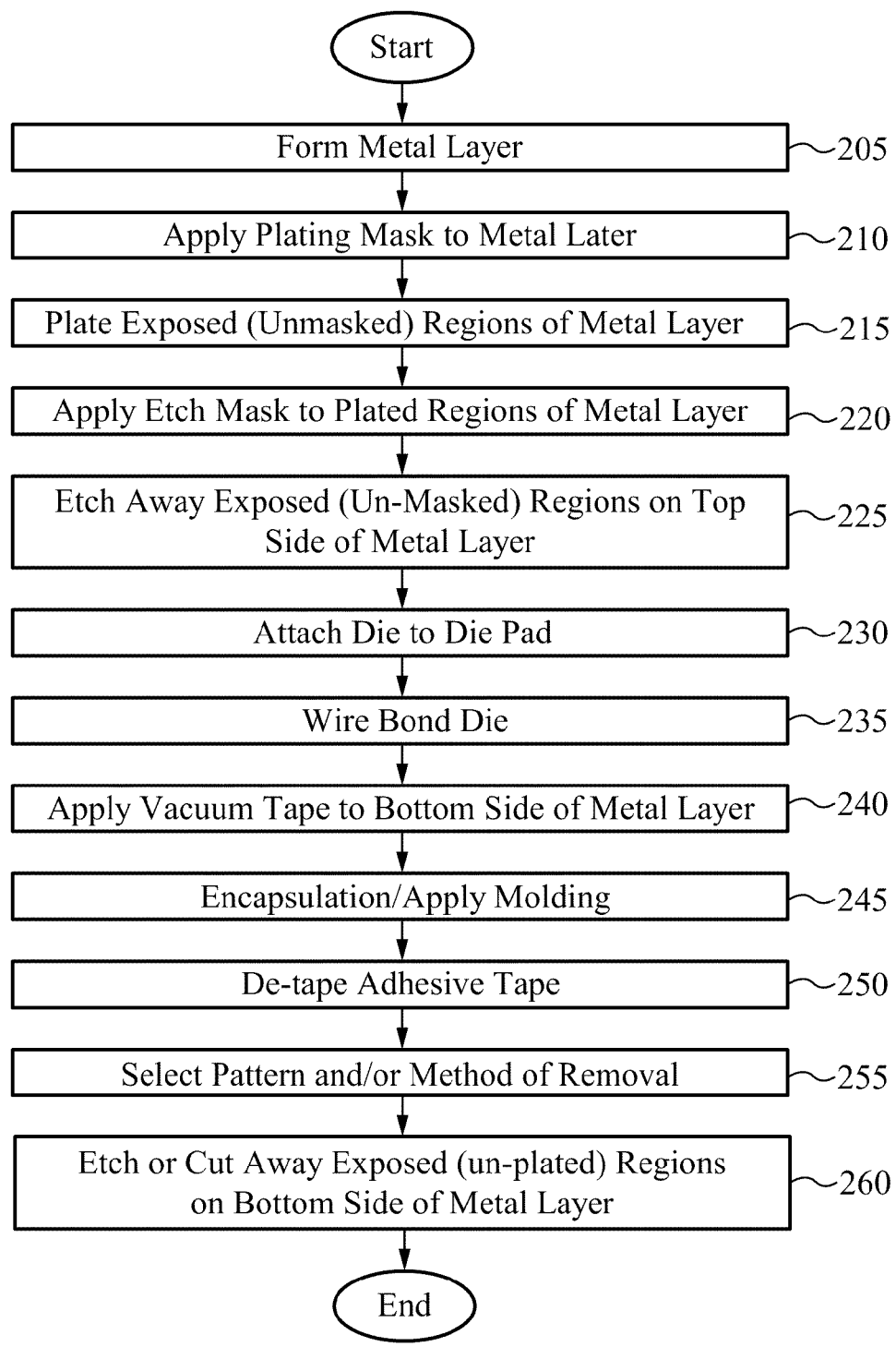
FIG. 2 illustrates a no pre-tape process for semiconductor package fabrication.
Figure 2A:
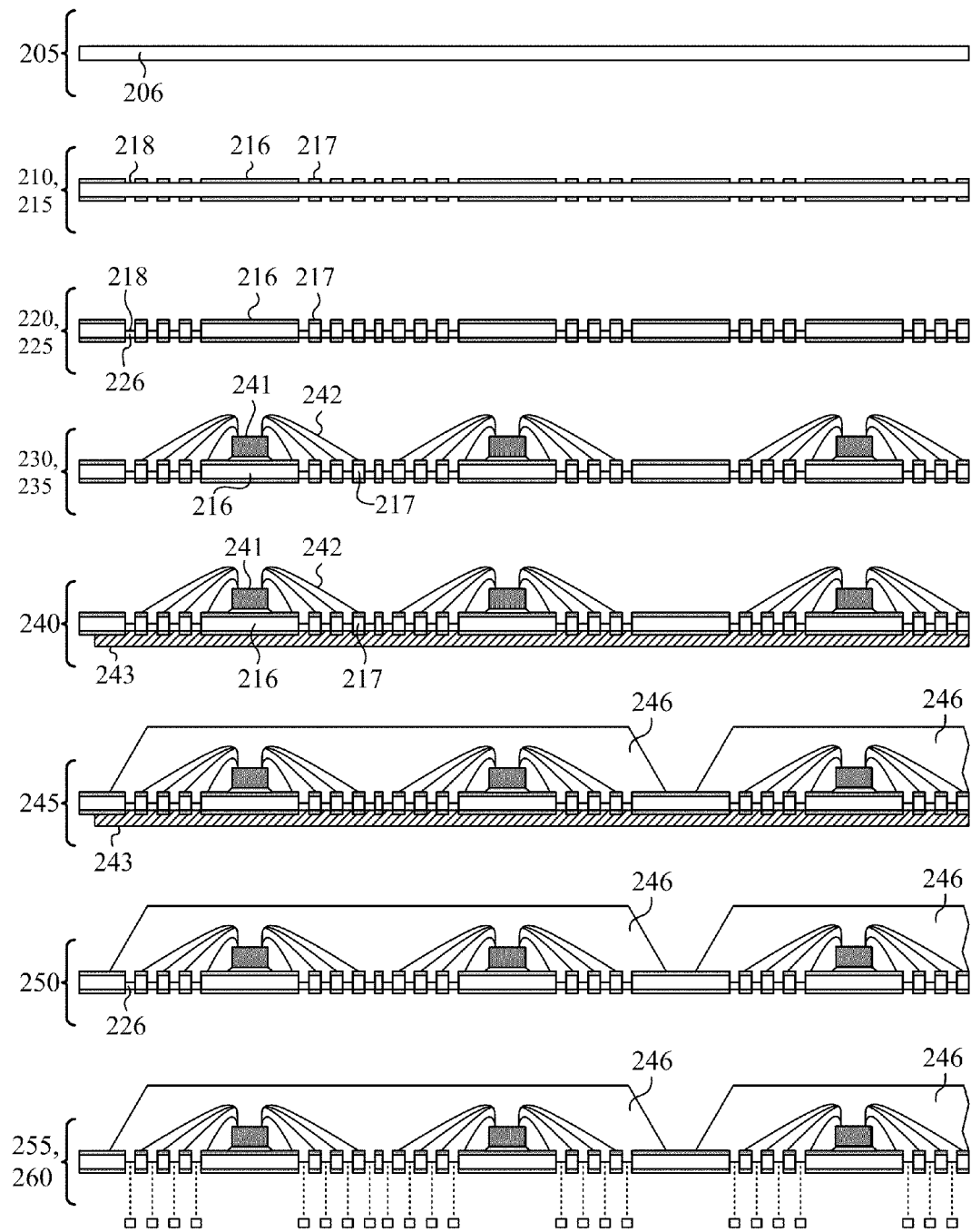
FIG. 2A illustrates an exemplary result produced by each step of the no pre-tape process of FIG. 2.

Some embodiments employ a different process to fabricate the leadframe and package. For instance, FIG. 2 illustrates semiconductor package fabrication with a no pre-tape process 200. The no pre-tape process 200 is sometimes also referred to as a tape or film "assist" molding process. As shown in FIG. 2, the no pre-tape process 200 begins at the step 205, where a metal layer 206 is formed. As illustrated in FIGS. 2 and 2A, the steps 205 through 225 of the no pre-tape process 200 are substantially similar to the steps 105 through 125 of the pre-tape process 100 describe above. However, at the steps 230 and 235 of the no pre-tape process 200 illustrated in FIG. 2, the no pre-tape process 200 diverges from the pre-tape process 100. Specifically, as illustrated in FIGS. 2 and 2A, at the steps 230 and 235 of the no pre-tape process 200, a die 241 is attached to a die pad 216 and wire bonded 242 to the die pad 216 and/or one or more contact pad(s) 217 of the lead frame. As shown in these figures, the die attach step 230 and the wire bonding step 235 occur before any taping occurs (at the step 240).

At the step 240, a vacuum tape 243 is applied to a bottom side of the metal layer 206. Some embodiments apply the vacuum tape 243 by using a molding machine. Several molding machines have been used successfully with various embodiments of the invention. For instance, the following provides a representative list of some of the molding machines used in conjunction with the processes 100 and 200 described above: Fico i-series such as the AMS-i-204 and AMS-i-306; Fico M-series such as the AMS-24-M2 and AMS-36-M3; Fico W-series such as the AMS-24-M2 and AMS-36-M3; Boschman such as the Flexstar and Packstar; Towa Y-series such as the YPS, YFG, and YFT; Daiichi GP-Pro; and the ASM Ideal Mold machine.

Regardless of the particular model and supplier, the molding machine employed by the no pre-tape process 200 typically does not use an adhesive, but instead uses a vacuum suction to adhere the vacuum tape 243 against the bottom side of the metal layer 206. Then, at the step 245, the die pad and the contact pads of the leadframe are encapsulated. The molding machine of these embodiments typically performs the encapsulation by using a plastic polymer compound 246. The molding machine also removes the vacuum tape 243 at the step 250. De-taping of the vacuum tape 243 is often easily accomplished by releasing the vacuum suction holding the vacuum tape 243 in place. The vacuum tape 243 prevents the plastic molding from encapsulating the bottom side of the metal layer 206. Thus, when the vacuum tape is removed at the step 250, the bottom surface of the leadframe, particularly any unplated connecting bars 226, are exposed.

Then, at the step 255, of some embodiments, a pattern for removal of the connecting bars and/or isolation of the contact pads is selected. Further, a method of removal is selected at the step 255 of some embodiments. Then, the no pre-tape process 200 of FIG. 2 transitions to the step 260, where the exposed (unplated) regions on a bottom side of the metal layer 206 (of FIG. 2A), particularly the connecting bars 226, are removed. Some embodiments remove the connecting bars 226 in specific patterns, for instance, to isolate the contact pads based on the pattern selected at the step 255. Further, some embodiments employ the method of removal selected at the step 255. For instance, in some embodiments, the exposed (un-plated) regions on the bottom side of the metal layer 206 are etched or cut away. As mentioned above, etching is performed by using a laser or a chemical etchant that is specific to the unplated regions of the metal layer 206. As an example, ammonium hydroxide or ammonium chloride will etch away the unplated connecting bars 226, without significantly affecting the die pad 216 and/or the contact pads 217 that were plated by using nickel, palladium, and/or gold. Alternatively, the connecting bars are cut away, in some embodiments, by using a saw blade, a laser, or another cutting means. As mentioned above, the removal of the connecting bars 226 is discussed further in Section IV.

Thus, as further illustrated in FIG. 2A, the step 260 of the no pre-tape process 200 leaves the plated surfaces of the die pad 216 and contact pads 217 not only exposed, but protruding from the bottom side of the semiconductor package. After the connecting bars are removed at the step 260, the no pre-tape process 200 concludes.

C. Additional Steps for LGA/BGA Fabrication

Regardless of whether the semiconductor package is fabricated by using the pre-tape process 100 or the no pre-tape process 200 described above, the semiconductor package of some embodiments is finalized as a ball grid array (BGA) or as a leadless grid array (LGA). To fabricate the semiconductor package as a BGA, some embodiments employ the BGA process 300 illustrated in FIG. 3. As shown in this figure, the BGA process 300 begins at the step 360, where solder is applied to the bottom side of the package. The step 360 of FIG. 3 typically follows the step 160 or the step 260 of FIGS. 1 and 2, respectively.

Figure 3:
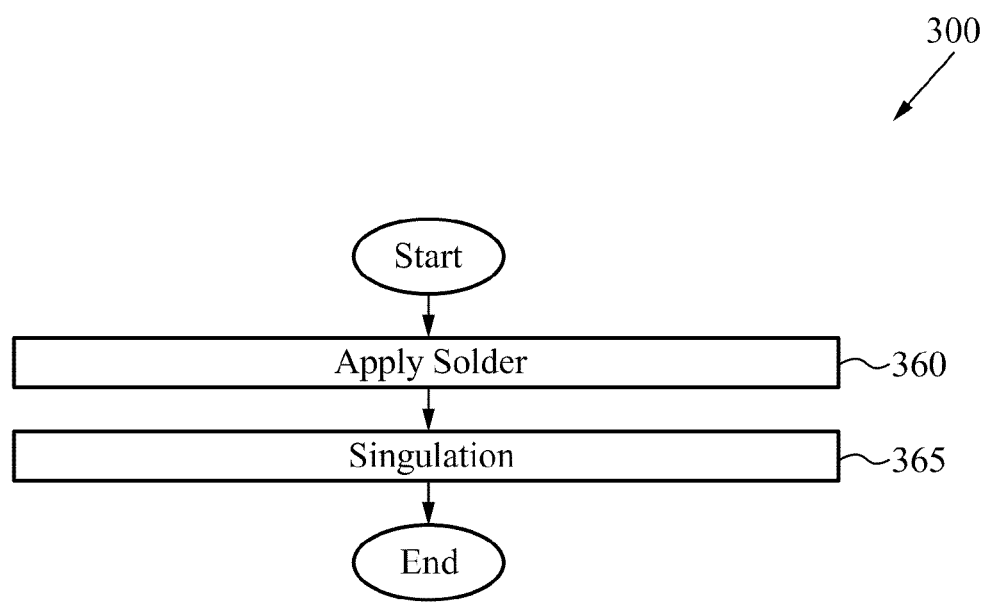
FIG. 3 illustrates the additional steps required to fabricate a ball grid array package.
Figure 3A:
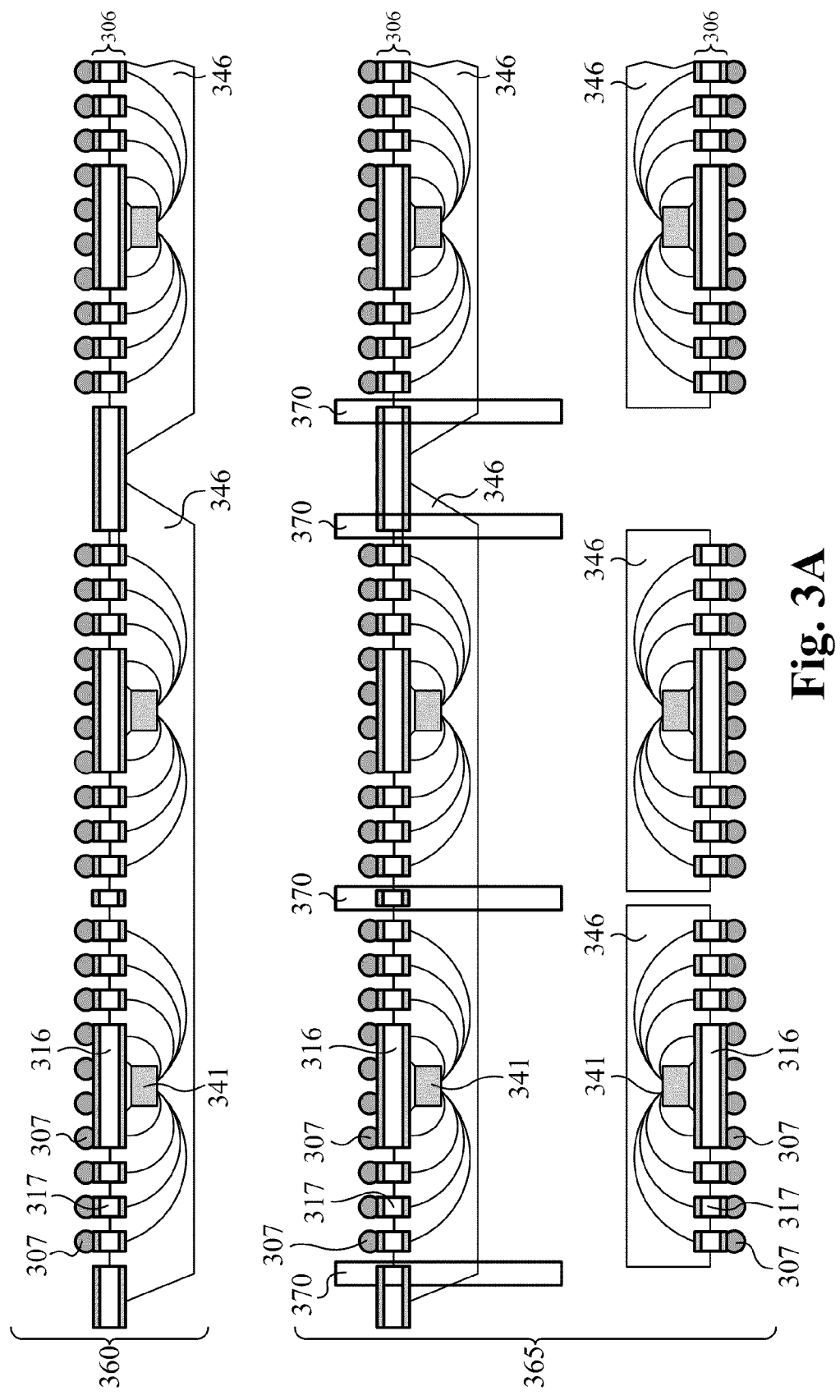
FIG. 3A illustrates an exemplary result produced by each step of the BGA process of FIG. 3.

As illustrated in FIG. 3A, some embodiments apply solder to the bottom side of the package by inverting the metal layer 306 and placing a stencil (not shown) over the bottom surface of the metal layer 306. The stencil is typically a standless-type metal stencil that has openings for each of the exposed and/or protruding portions of the leadframe. For example, in the embodiment shown in FIG. 3A, the stencil has openings for each of the contact pads 317 and the die pad 316. With the stencil held against the exposed portions of the leadframe, a layer of solder paste is wiped across the stencil. Accordingly, the solder paste is forced into the openings in the stencil, and when the stencil is removed, a set of solder balls 307 remain on each of the contact pads 317 and the die pad 316.

Figure 5:
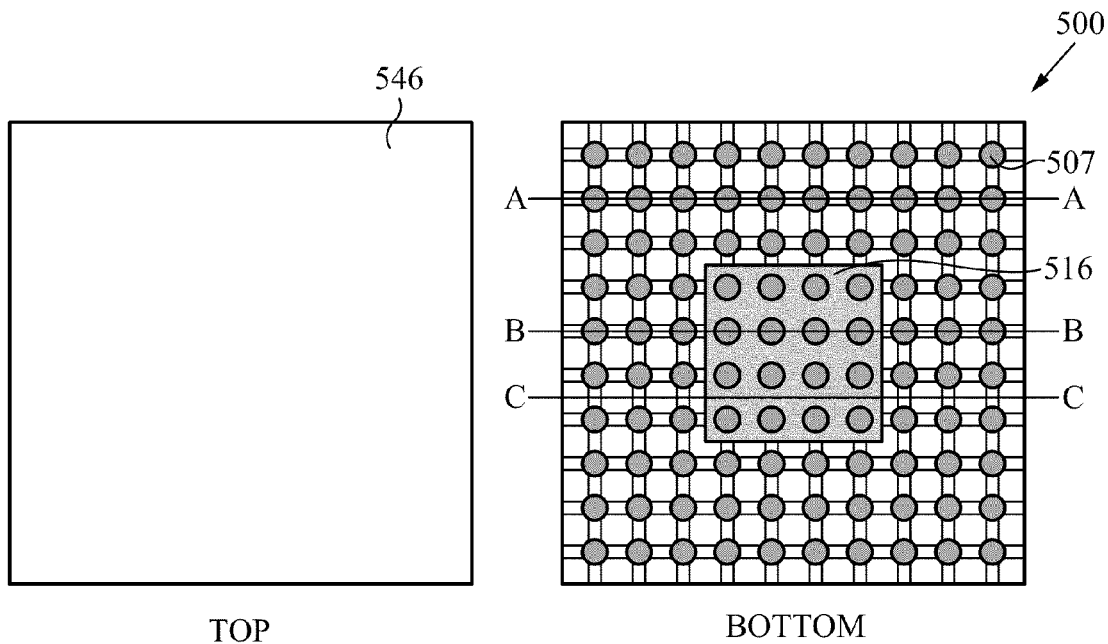
FIG. 5 illustrates multiple views of a BGA with a die pad having solder balls produced by the BGA process of FIG. 3.
Figure 5A:
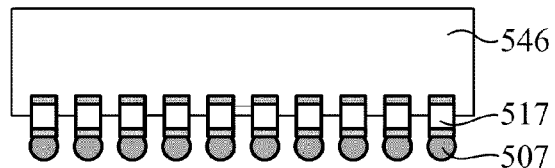
Figure 5B:
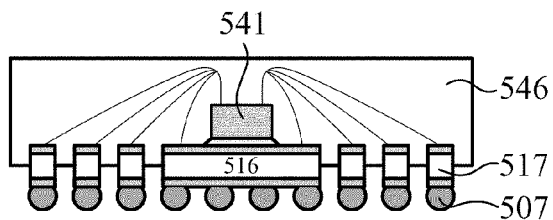
Figure 5C:
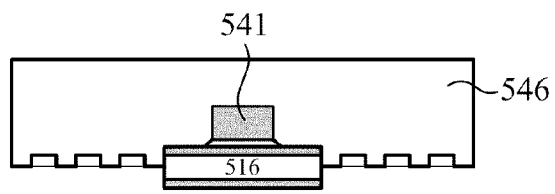

FIGS. 5-5C illustrate an exemplary BGA formed by using the BGA process 300 illustrated in FIG. 3. As shown in FIG. 5, the BGA 500 has a top and bottom, an exposed die pad 516 and several solder balls 507 on the die pad 516 and obscuring each contact pad 517. The contact pads 517 are more readily illustrated in cross section (slice) views 5A and 5B. Slice view 5A illustrates a slice through a line of solder balls 507 attached to a set of contact pads 517. Slice view 5B illustrates a slice through a line of solder balls 507 attached to a set of contact pads 517 and the die pad 516. Slice view 5C illustrates a slice of the package that is between two columns or rows of solder balls 507 that are attached to sets of contact pads 517, only.

Figure 6:
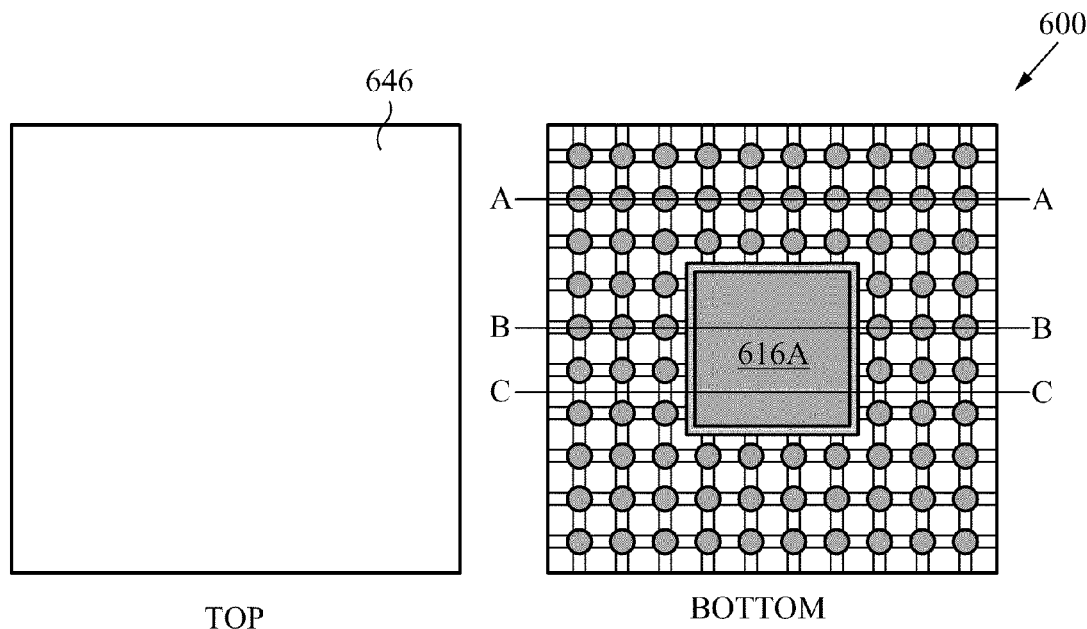
FIG. 6 illustrates multiple views of a BGA with a die pad having a solder layer instead of solder balls.
Figure 6A:
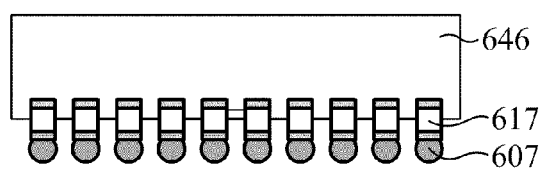
Figure 6B:
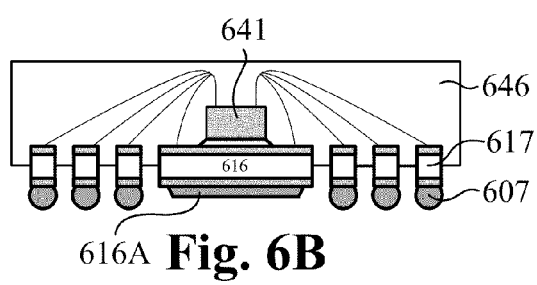
Figure 6C:
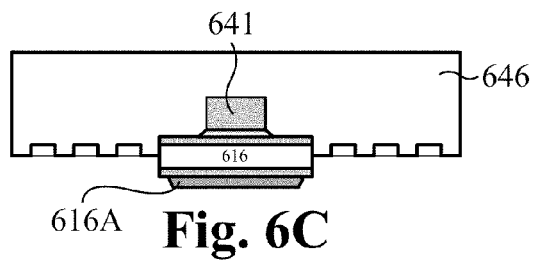

Alternatively, the stencil of some embodiments has a single opening over the die pad, which causes a small layer of solder to be formed on the die pad, instead of the solder balls 507 illustrated in FIG. 5. An exemplary product of these embodiments is illustrated in FIG. 6 and slice views 6A-6C. As shown in FIG. 6, the die pad 616 of an exemplary BGA 600 has a layer of solder 616A instead of the solder balls.

Regardless of the solder's shape, once the solder is applied to the exposed die pad and contact pads of the leadframe, the BGA process transitions to the step 365 of FIG. 3, where the package is singulated from the molded sheet (or strip) of packages by using a singulation procedure. Singulation is performed differently in different embodiments. For example, some embodiments perform singulation by punching, while some embodiments perform dicing. Dicing includes sawing with a blade and/or cutting with a laser. After the singulation step 365, the BGS process 300 concludes. Singulation is discussed further in relation to FIG. 4.

Figure 4:
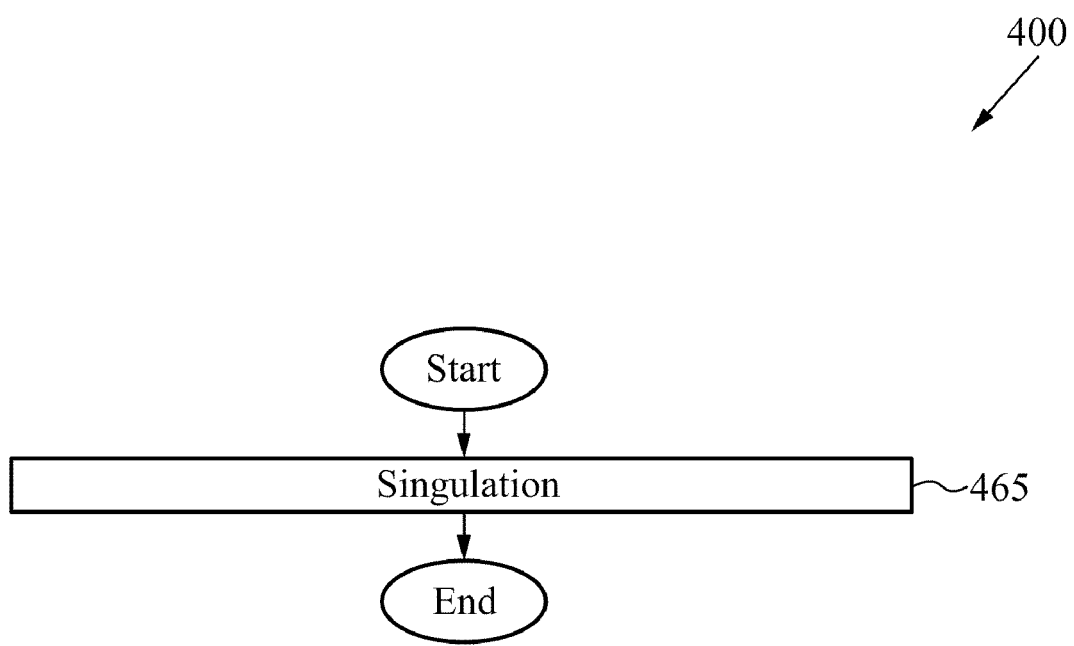
FIG. 4 illustrates the additional steps required to fabricate a leadless grid array package.

FIG. 4 illustrates that the fabrication of an LGA does not require the step of applying solder paste or balls as described above in relation to BGA fabrication. As shown in FIG. 4, the fabrication of an LGA requires only the addition of the singulation step 465 after the step 160 of FIG. 1, or the step 260 of FIG. 2 (removing the connecting bars). As illustrated in FIG. 4A, some plated regions 470 of the metal layer 406 extend beyond a single leadframe and/or extend beyond a single semiconductor package. The plated regions 470 of these embodiments allow the simultaneous fabrication of several leadframes and packages at once from a single metal sheet. These plated regions 470 are typically also removed during the singulation steps 365 and 465 illustrated in FIGS. 3, 3A, 4 and 4A. Some embodiments employ a conventional dicing saw for the singulation step. Singulation is generally discussed in the co-owned U.S. Pat. No. 7,572,168, issued on Aug. 11, 2009, and entitled "METHOD AND APPARATUS FOR HIGH SPEED SINGULATION," which is incorporated herein by reference.

Figure 7:
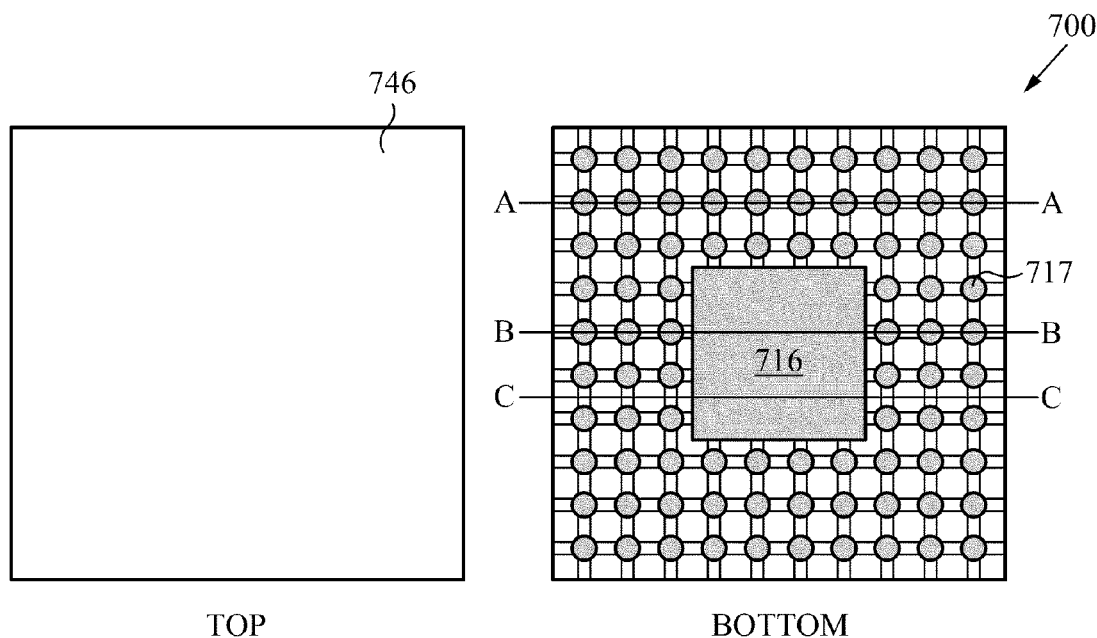
FIG. 7 illustrates multiple views of an LGA produced by the LGA process illustrated in FIG. 4.

FIG. 7 illustrates an exemplary LGA package produced by using the LGA process 400 illustrated in FIG. 4. As shown in this figure, the LGA package 700 has a top and bottom with an exposed plated die pad 716 and contact pads 717 that protrude from the bottom of the LGA package 700. The exemplary LGA package 700 illustrated in FIG. 7 and additional exemplary embodiments of the invention are further described below in the next section.

III. Semiconductor Device Leadframe and Package

A. Fabricated Package

Figure 7A:
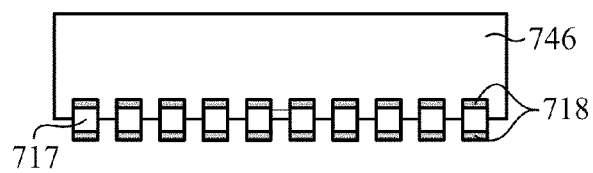

As mentioned above, FIG. 7 includes a bottom view of a semiconductor package 700 in accordance with some embodiments of the invention. The package 700 is exemplary of several packages produced by the fabrication processes 100 and 200 discussed above. Cross section (slice) view 7A is a slice of the package 700 at line A-A, slice view 7B is a slice along line B-B, and slice view 7C is a slice along line C-C. The package 700 contains a die pad 716 and several exemplary rows of contact pads 717 around the die pad 716. FIG. 7A illustrates a metal plating 718 covers the top and bottom surfaces of the die pad 716 and the contact pads 717, as described above. Also discussed above, the metal plating 718 typically includes some combination of Ni/Pd/Au, and/or alloys thereof. As used herein, unless the context indicates otherwise, such directional terms as "top" and "bottom" refer to a package oriented with the exposed portion of the die pad and/or contact pads facing downward. However, one of ordinary skill will recognize the various different orientations of the exemplary semiconductor packages discussed herein.

Figure 7B:
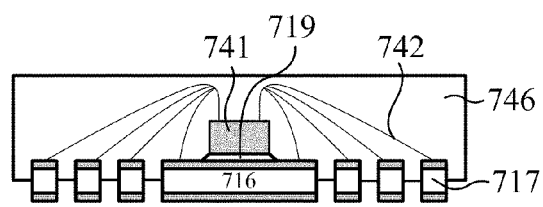
Figure 7C:
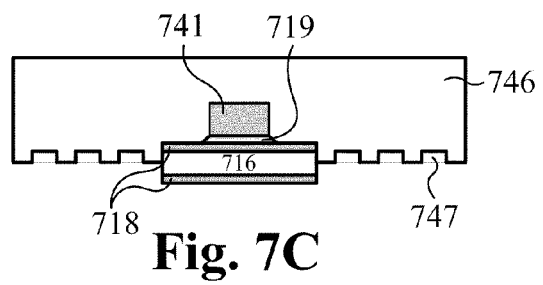

As illustrated in FIG. 7B, a die 741 is typically mounted on the die pad 716 by means of an epoxy layer 719, and bonding wires 742 extend from terminals (not shown) on the die 741 to various contact pads 717. Typically, each bonding wire 742 couples a terminal on the die 741 to a contact pad 717. A protective molding 746 encapsulates the die 741, the bonding wires 742, and the top portions of a leadframe comprising the die pad 716 and the contact pads 717. In some embodiments, the bottom surface of the molding 746 is located at approximately the midpoint of the thickness of the die pad 716 and the contact pads 717, as a result of the encapsulation, half etching, and taping steps of the processes 100 and 200 described above. This feature of the fabricated package is illustrated by slice views 7A-7C.

Specifically shown in slice view 7C, the bottom surface of the molding 746 has a series of recesses 747, which are formed at locations where the connecting bars (not shown) between a pair of neighboring contact pads 717, and between the die pad 716 and a contact pad 717 are removed by etching, sawing, cutting, or by other means.

One of ordinary skill will recognize variations in the packages and fabrication methods described above. For instance, some embodiments fabricate a "flip-chip" style semiconductor package. In the flip-chip package, the die face is directly soldered or otherwise electrically connected to the die pad and/or one or more contact pads, rather than wire bonded. Flip-chip style packages are further described in relation to FIGS. 17A-20B below.

B. Leadframes

As mentioned above, the semiconductor package typically includes a leadframe that was fabricated during the fabrication processes 100 and 200, discussed above. The leadframe is typically mass produced from a metal sheet to facilitate the fabrication of the semiconductor packages. For instance, the packages described above, such as the package 700, for example, is fabricated by using a strip of leadframes 800 illustrated in FIG. 8. The leadframes in the strip 800 are particularly suited to fabrication by using the pre-tape process 100 and the no pre-tape process 200.

Figure 8:
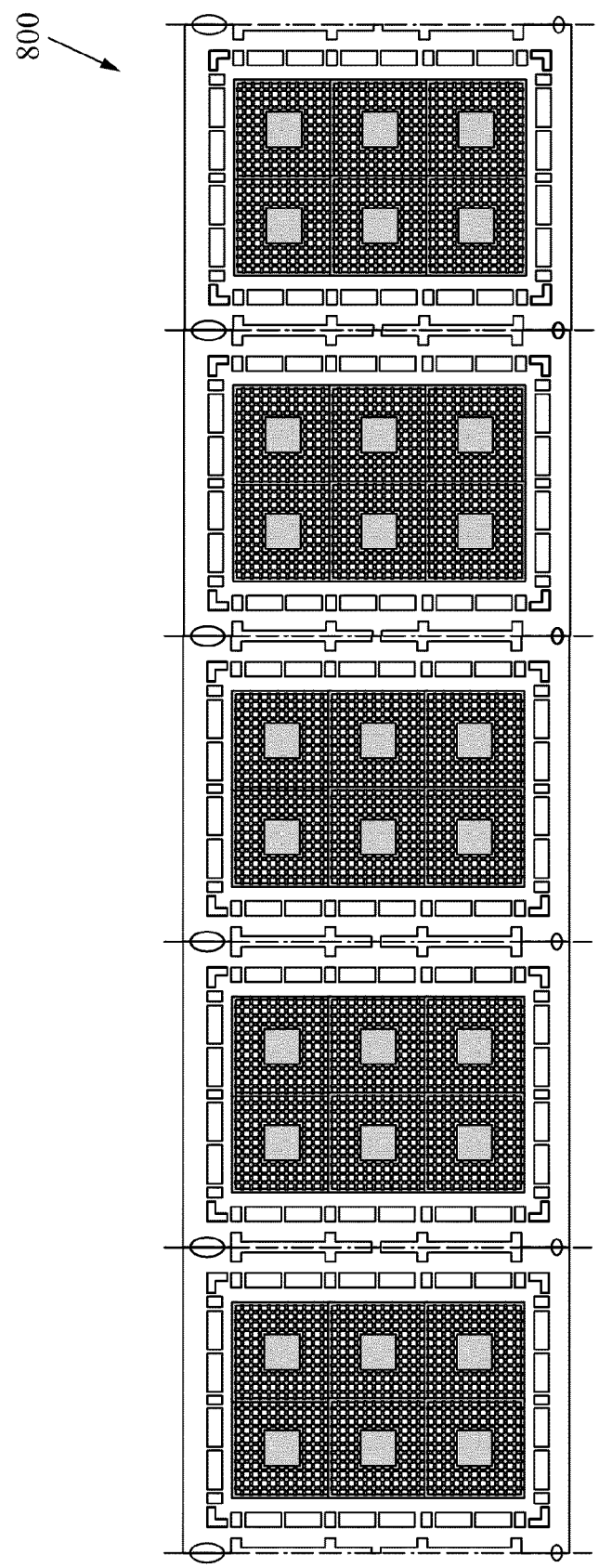
FIG. 8 illustrates several leadframes on a strip that is used by the processes illustrated in FIGS. 1 and 2 to fabricate the semiconductor packages illustrated in FIGS. 5, 6 and 7.

The features of these leadframes are more apparent in the close up views of the strip 800 that are provided by FIG. 9. As shown in FIG. 9, a particular section 900 of the strip 800 has six die pads 916, each surrounded by several contact pads 917. In some embodiments, the section 900 forms a single leadframe in the strip of leadframes 800, illustrated in FIG. 8. In the section 900, the close up view of the die pad 916 and the contact pads 917 in its vicinity represent a pre-cursor to grid arrays, such as the grid arrays in the LGA and BGA packages discussed above. Specifically, FIGS. 8 and 9 illustrate the leadframes at the steps 125 and 225 (the half etch steps) of the processes 100 and 200, respectively.

Thus, FIG. 9 illustrates that the die pad 916 and its adjacent contact pads 917 are joined by connecting bars 926, and that each pair of the contact pads 917 are joined by a connecting bar 926. As illustrated in FIG. 9, the connecting bars 926 of some embodiments are half etched such that the thickness of the connecting bars 926 is roughly half the thickness of the die pad 916 and the contact pads 917. In FIG. 9, the connecting bars 926 are shown without shading to illustrate this feature. In contrast to the unshaded connecting bars 926, the die pad 916 and the contact pads 917 are shown with gray shading to indicate that they are both thicker and have metal plated surfaces.

Further illustrated in the close up views of FIG. 9, the die pad 916 and a set of nearby contact pads 917 are bordered by a plated region 970. As mentioned above in relation to FIGS. 3 and 4, the plated region 970 is typically severed during singulation to yield an individual semiconductor package.

Slice views 9A and 9B illustrate in detail that the half etching steps 125 and 225 (of FIGS. 1 and 2, respectively), have formed the connecting bars 926 by half etching the top of a metal layer 906. The metal layer 906 of some embodiments is formed from a copper sheet. Thus, the connecting bars 926 of these embodiments are some fraction of the thickness of the copper sheet. Preferably the connecting bars 926 are substantially half the thickness of the copper sheet. However, the plated region 970, the die pad 916, and the contact pads 917, have been masked (in the steps 120 and 220 of FIGS. 1 and 2) and thus remain at the full thickness of the original metal layer. Moreover, as shown in the slice views 9A and 9B, the plated region 970, the die pad 916, and the contact pad(s) 917 have been plated (at the steps 115 and 215) with some combination of Ni/Pd/Au, and/or one or more alloys thereof.

C. More Examples of Leadframes and Packages

A wide variety of leadframes and resulting packages can be produced by the methods described above. Some examples of the variety of packages are illustrated in FIGS. 10A-20B. In each pair of drawings, the "A" drawing is a cross-section (or "slice") view of the package shown in the "B" drawing. The "B" drawing is a bottom view of each package. As used herein, a slice view contains no background features that may lie behind the plane of the slice, whereas a cross section view may contain features of the background plane, that are not in the slice plane.

Figure 10A:
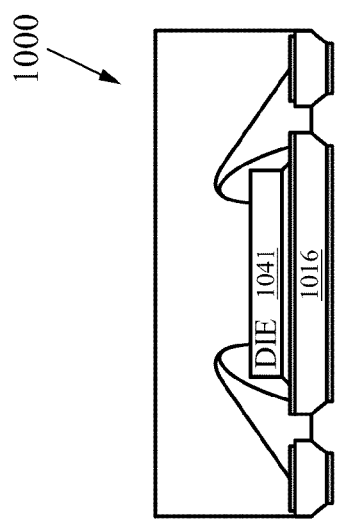
Figure 10B:
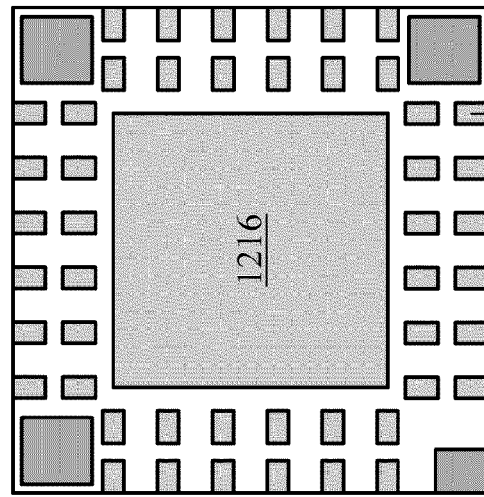

FIGS. 10A and 10B illustrate a quad flat no lead (QFN) package 1000 having three contact pads 1017 on each side of a central die pad 1016. The QFN package 1000 is formed by using either of the pre-tape or no pre-tape processes (100 or 200) described above. For instance, in the QFN package 1000, the region between the die pad 1016 and the contact pads 1017 is comparatively substantial (capable of sustaining several substantial connecting bars). Accordingly, the leadframe and connecting bars, which are the precursor for the package design 1000 illustrated in FIG. 10, are likely sufficiently structurally for handling, and particularly during the wire bonding process. Hence, some embodiments will advantageously employ the no-pretape process 200 to manufacture the package 1000. Further, some embodiments select the appropriate pattern for the package 1000 during the process 200 and execute the design and/or pattern by using the various methods of masking, plating, etching, cutting, and/or sawing described above. The figures and description below provide additional examples.

Figure 11A:
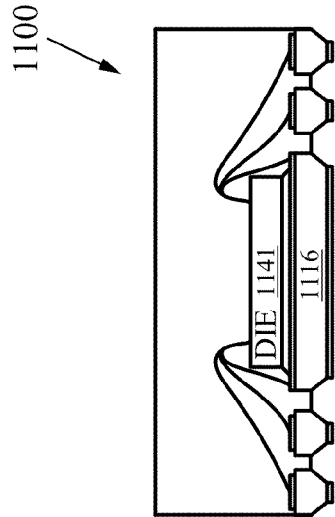
Figure 11B:
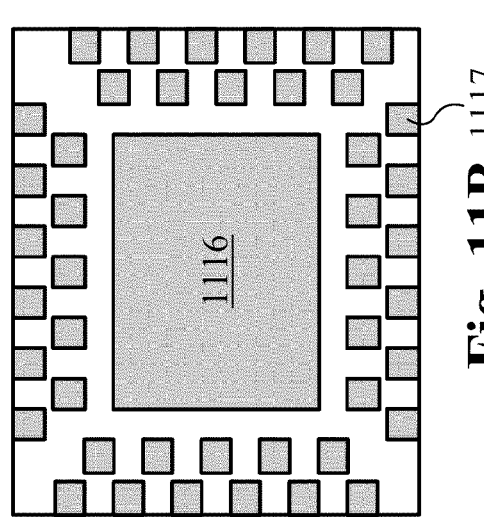

For instance, FIGS. 11A and 11B illustrate a QFN package 1100 with two rows of contact pads 1117 around a central die pad 1116. Specifically, the contact pads 1117 in each row are offset from the contact pads in the other row. Due to this pattern of contact pads, the package 1100 has particular requirements for manufacture, and issues with structural integrity during handling and/or wire bonding. Hence, some embodiments will particularly employ the pre-tape process 100 in conjunction with, or instead of, a set of connecting bars, during the manufacture of the package 1100. Additionally, some embodiments employ a set of thicker connecting bars for added strength. Moreover, some embodiments select a method of removal for the connecting bars that is appropriate to the pattern of multiple rows of offset contact pads, such as, for example, when the contact pad pattern presents difficulties for blade saw removal of the connecting bars. FIG. 11B illustrates such a case. In these cases, some embodiments advantageously employ laser etching and/or cutting to remove the connecting bars.

Figure 12A:
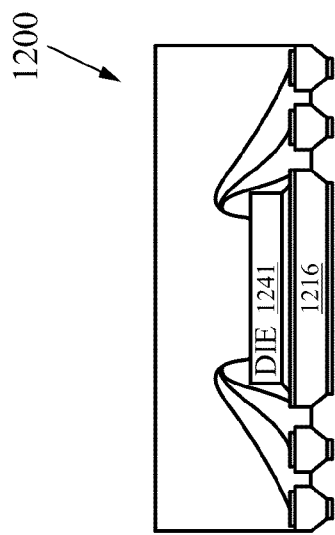
Figure 12B:
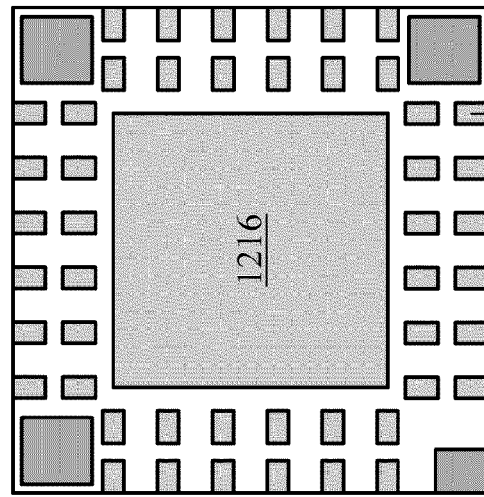

FIGS. 12A and 12B illustrate a QFN package 1200 that is similar to the package 1100 (in FIG. 11) except that the contact pads 1217 are not offset from each other and there are four [large contact pads] at the corners of the package 1200. Here, as above, one of ordinary skill will recognize the particular applications of the processes 100 and 200 (of FIGS. 1 and 2) to the package 1200 illustrated in FIG. 12.

FIGS. 13A and 13B illustrate a QFN package 1300 that is similar to the package 1000 (illustrated in FIGS. 10A and 10B) except that a shelf is formed around the edges of the die pad 1316. Some embodiments form the shelf by using the masking, plating, and etching steps in the processes 100 and 200 (of FIGS. 1 and 2, respectively), such that the die pad 1316 has a top surface larger than its bottom surface. For instance, some embodiments plate a large area on the top surface of a metal sheet and plate a smaller area below the large area on the bottom surface of the metal sheet. These embodiments then remove the unplated regions around the large and small plated areas to form the shelf shaped die pad 1316 illustrated in FIGS. 13A and 13B. As mentioned, the removal of the unplated regions is performed by chemical etching, with a laser, or with a saw blade.

Figure 25:
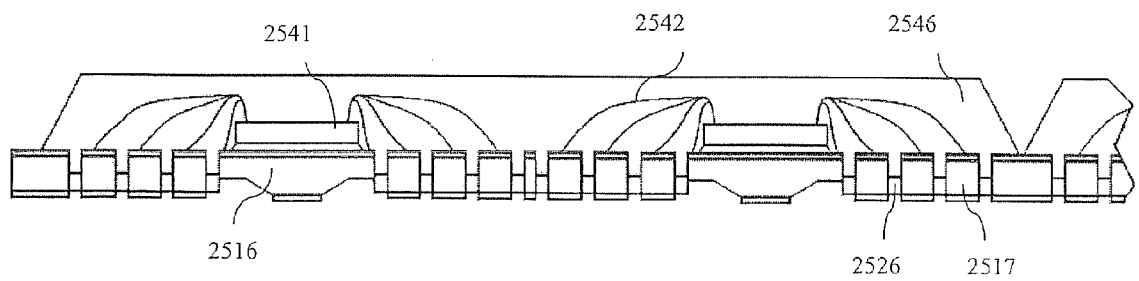
FIG. 25 illustrates an exemplary intermediary package before removal of connecting bars according to some embodiments of the invention.

As discussed above, a die pad can be formed according to a design and/or pattern. First, a metal layer is plated, as described in FIGS. 1 and 1A. The plated regions typically form a die pad and contact pads. In some embodiments, a shelf can be formed around the die pad. FIG. 25 illustrates an exemplary intermediary package in a strip of packages before removal of connecting bars 2526 and singulation according to some embodiments of the invention. A shelf is formed around the edges of a die pad 2516. In some embodiments, the top surface of the die pad 2516 is lager than the bottom surface of the die pad 2516 by plating a large region on the top surface of the metal sheet and a smaller area below the large area on the bottom surface of the metal sheet. As mentioned above, the removal of the unplated regions is performed by chemical etching, with a laser or with a saw blade. In some embodiments, the thickness of the top portion of the die pad 2516 is uniform, while the thickness of the bottom portion of the die pad 2516 is nonuniform. A die 2541 is wire bonded 2541 to the die pad 2516 and/or the contact pad(s) 2517. An overmolding 2546 encapsulates at least the die 2541 and the wire bond(s) 2542.

Figure 24A:
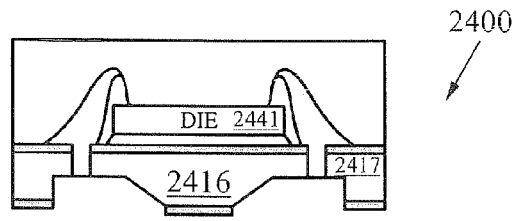
Figure 24B:
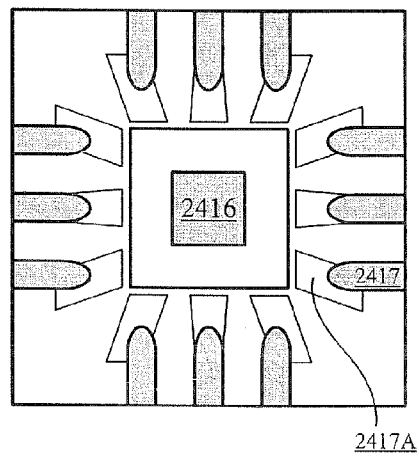

FIGS. 24A and 24B illustrate a package 2400 that is similar to the package 1300 (of FIG. 13) except that contact pads 2417 are half-etched at the same time that the connecting bars are removed to form a shelf 2417A on the interior end of each contact pad 2417.

Those of ordinary skill having the benefit of this disclosure will readily appreciate that the elements of the several embodiments are interoperable and interchangeable therebetween as necessary to achieve specific application goals.

FIGS. 14A and 14B illustrate a dual flat no-lead (DFN) package 1400 with two rows of three contact pads 1417 on opposite sides of the package 1400. Preferably, the contact pads 1417 are half-etched at the same time that the connecting bars are removed to form a shelf 1417A on the interior end of each contact pad 1417. The package 1400 does not include a die pad, and the die 1441 is mounted with a layer of epoxy directly onto the shelf 1417A of each of the contact pads 1417.

FIGS. 15A and 15B illustrate a package 1500 that is similar to the package 1400 (of FIG. 14) except that a center bar runs between two contact pads located at opposite ends of the package 1500. Some embodiments form the center bar [in the same step in which the connecting bars are removed].

FIGS. 16A and 16B illustrate a QFN package 1600 that is similar to the package 1000 (illustrated in FIGS. 10A and 10B) except that slots are formed in the die pad 1616 and the areas around each of the slots are half-etched to form half thick contact pads 1617A that are coplanar with the bottom of the molding 1646 and are thus exposed at the bottom of the package 1600, but that are not coplanar with the protruding plated regions of the die pad 1616 and the full thickness contact pads 1617. Some embodiments form the half thick contact pads 1617A during the same process step in which the connecting bars are removed.

FIGS. 17A-B, 18A-B, 19A-B and 20A-B, in particular illustrate "flip chip" style packages, in which the die is inverted and connections are made directly between the terminals on the die and the die pad and/or the contact pads. The connections are made with solder balls, in some embodiments. In each of the packages (1700, 1800, 1900, 2000) illustrated in these figures, the interior end of each contact has a shelf, and the solder balls connect the upper surface of the shelf to the die pad.

Specifically, FIGS. 17A and 17B illustrate a QFN package 1700 with a die pad 1716 surrounded by contact pads 1717 each of which has a shelf 1717A. Terminals on the die 1741 are connected to the die pad 1716 and the contact pads 1717 (including the shelves 1717A) by solder balls.

FIGS. 18A and 18B illustrate a QFN package 1800 that is similar to the package 1700 of FIG. 17, except that the die pad 1716 is omitted.

FIGS. 19A and 19B illustrate a DFN package 1900 with no die pad and where the shelf 1917A of each contact pad 1917 is angled.

FIGS. 20A and 20B illustrate a DFN package 2000 that is similar to the DFN package 1900 of FIG. 19 except that the shelf 2017A on each of the contact pads 2017 is straight.

All of the packages illustrated in FIGS. 10A-20B are fabricated by using one or more leadframes having connecting bars between the contact pads, and between the contact pads and the die pad (for those packages that include a die pad). In some of the embodiments described above, the connecting bars are removed by chemical etching. Alternatively, the connecting bars are removed by other techniques, such as by laser cutting or etching, and/or by blade sawing. These techniques are described further in the next section.

IV. Advantages

Some embodiments employ a combination of connecting bar patterns, and plating, masking, and/or etching patterns, to form multiple rows of contact pads. Some of these embodiments select and/or match each pattern with an appropriate method of removing the connecting bars to isolate each contact pad as specified by the pattern. As mentioned above, the methods of removal include chemical and laser, etching or cutting, and blade sawing.

A. Singulation and/or Etching Patterns

Figure 21:
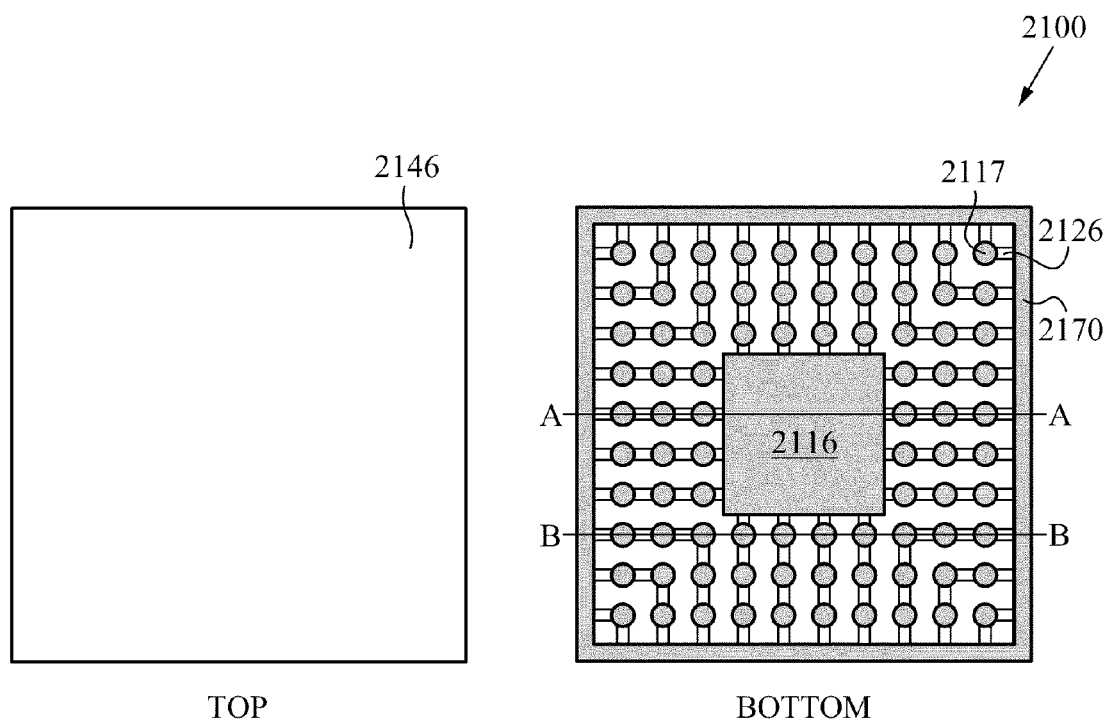
FIG. 21 illustrates an array of contact pads and connecting bars of a leadframe that is suitable for laser cutting or blade sawing the connecting bars to separate the contact pads from each other and from the die pad.
Figure 21A:
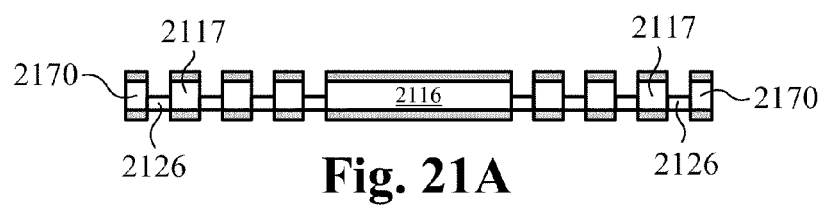
Figure 21B:
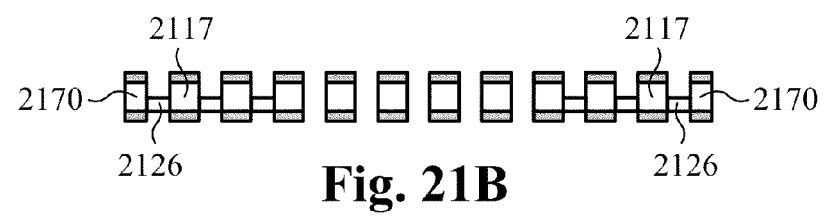

The processes of Section II and the leadframes and packages of Section III particularly lend themselves to specific isolation and/or singulation patterns. For instance, FIG. 21 illustrates a specific arrangement 2100 of a die pad 2116 and contact pads 2117 in an array of a leadframe that has a pattern that is different from the grid arrays illustrated above. This specific arrangement 2100 has a particular pattern of connecting bars 2126 between the die pad 2116 and its adjacent contact pads 2117, and between certain pairs of contact pads 2117, such that a set of parallel "L" shaped paths are formed within a section bordered by a plated region 2170. The particular patterns of some connecting bar arrays, such as the "L" shaped pattern of FIG. 21 and the many configurations of packages illustrated in Section III, require specific fabrication techniques.

For instance, the generic grid array arrangement 2100 of some embodiments is mass produced on quantities of metal sheets or strips. Some embodiments then later customize the quantities of the arrangement 2100 into the specific packages illustrated in Section III by using specific customization techniques. These techniques are similar to a singulation process used to separate the individual finished semiconductor devices and/or packages, and often occur prior to, or during, the singulation process. Some of these techniques are discussed below.

B. Laser Cutting or Etching

Figure 22:
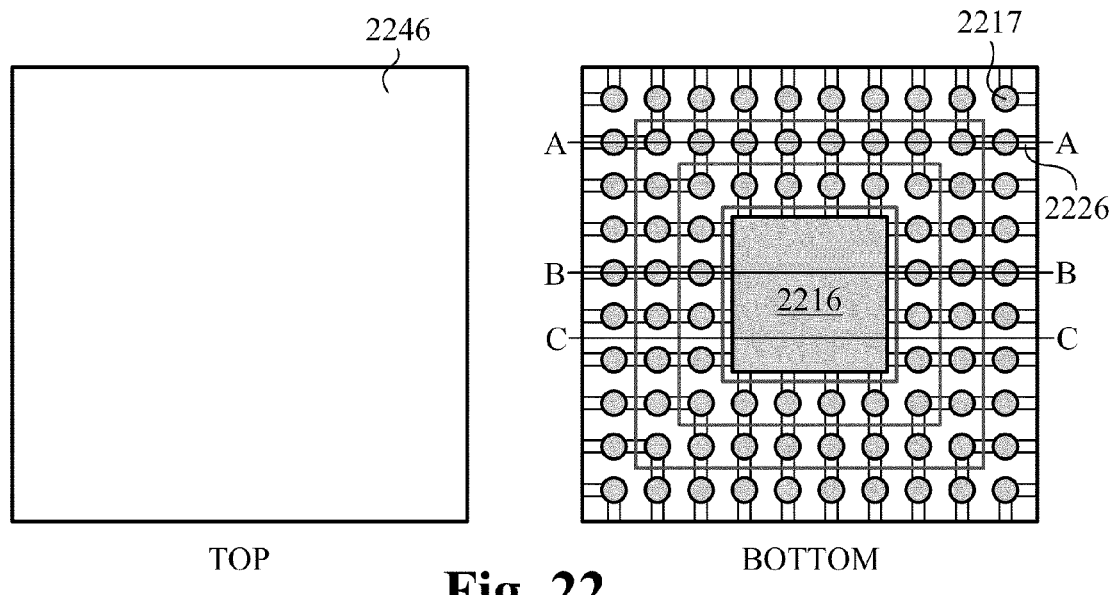
FIG. 22 illustrates possible cutting paths of a laser to remove connecting bars to separate the contact pads in the array of the leadframe illustrated in FIG. 21.
Figure 22A:
Figure 22B:
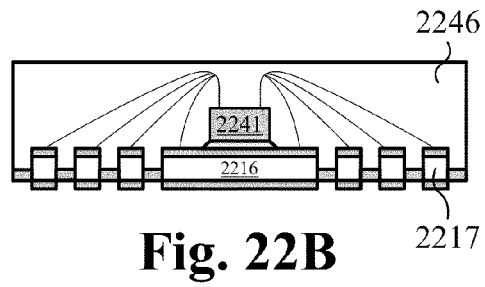
Figure 22C:
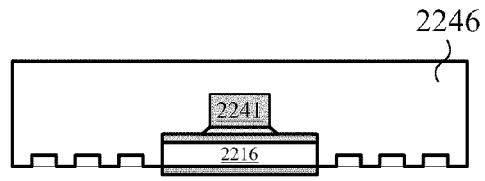

FIG. 22 illustrates that some embodiments use a laser to remove the connecting bars forming the array pattern 2100 illustrated in FIG. 21. FIG. 22 shows some possible paths of a laser beam that removes the connecting bars along the paths by laser etching or cutting. Each of the lines illustrated in FIG. 22 describes a square that is concentric about the die pad 2216. As mentioned above, by removing particular connecting bars 2226 from the array or arrangement 2200, in conjunction with the masking, plating, and/or etching steps described above, some embodiments produce the custom packages illustrated in Section III. The use of a laser in these embodiments has certain advantages in the targeted removal of particular connecting bars. For instance, the pattern of contact pads of some embodiment poses particular constraints. Some of these constraints were described in relation to the FIGS. 10A-20B above.

As shown in FIG. 22 and the FIGS. 10A-20B described above, the laser of some embodiments has the particular advantages of spot cutting and/or cutting along a precise line. However, the laser also has a drawback related to over-burning of the encapsulant compound. Thus, some embodiments avoid (re) crossing a cut line or double spot cutting within the same area when using a laser, in order to prevent over-burning.

C. Blade Sawing

Similarly, FIG. 23 illustrates that some embodiments use a saw blade to remove the connecting bars forming the array pattern 2100 illustrated in FIG. 21. Thus, FIG. 23 illustrates a possible set of paths of a saw blade that is used to remove one or more of the connecting bars 2326 from the arrangement 2300, illustrated in FIG. 23, to produce a customized package.

As mentioned above, the blade sawing, and chemical or laser etching, described in relation to FIGS. 21-23 are often performed in conjunction with the singulation steps 365 and 465 of FIGS. 3 and 4, respectively. Alternatively, the removal of the connecting bars is performed in conjunction with the steps 155,160 and 255,260 of FIGS. 1 and 2, respectively, or at other times in additional embodiments of the invention.

D. The Pre-Tape and No Pre-Tape Processes

In some instances, the pre-tape (adhesive) process has particular advantages, while in some instances the no pre-tape (vacuum) process has particular advantages. In these various instances, the semiconductor package design and/or the leadframe structure are factors in determining whether the pre-tape or the no pre-tape process is preferred. For instance, the structure of some package designs (including the contact pad and/or die pad patterns) causes the leadframe to have less structural strength. A structurally weak leadframe undesirably causes difficulty in handling the leadframes and semiconductor packages before encapsulation, and particularly during the wire bonding process. Errors during wire bonding and mishandling due to weak leadframes lowers the useful yield of the manufactured packages, and further undesirably causes quality issues in the finished product.

Typically, both the pre-tape and no pre-tape processes are serviceable for all leadframe patterns and designs, but if the connecting bars are thin and/or form weak structural integrity, the pre-tape helps to hold the whole leadframe structure together for handling and wire bonding. Thus, the more reliable leadframe structure provides better overall manufacturing yield, and quality. In these instances, the pre-tape process provides additional structural integrity to the strips of leadframes, which makes the leadframes easier to handle and improves wire bonding, yield, and quality.

However, in some embodiments the connecting bars are sufficiently thick and strong to make the no pre-tape (vacuum) process a preferable alternative. In these cases, if the connecting bars are thick enough or there are many connecting bars, then there is no significant difference in quality and yield between the pre-tape and no pre-tape processes. However, the no pre-tape process generally has lower cost, since the tape is reusable and no adhesive is consumed. Thus, in these cases, the no pre-tape process is preferred.

Accordingly, there is a relationship between the connecting bars and the tape, employed by some embodiments. For instance, if the connecting bars of a leadframe are formed too small or are otherwise defective, there is less connection strength. As mentioned above, the tape is typically used to prevent resin from encasing the exposed contacts on the bottom of the package during encapsulation. However, in these cases the (adhesive) tape of the pre-tape process also provides additional structural integrity and is preferred over the no pre-tape process, particularly for contact pad patterns having few or weak connecting bars. Hence, in some embodiments, both the connecting bars and the tape provide support for the leadframe before encapsulation. Then, both the (adhesive) pre-tape and the connecting bars are removed after encapsulation when they are no longer needed.

In additional embodiments, the pattern and/or shape of the connecting bars is related to the pattern and/or shape of the contact pads. In these embodiments, the contact pads and connecting bars are designed to match such constraints as the position of the terminals of the die(s) and the physical requirements of the wire bonds. Hence, Section III illustrates a variety of different packages, having a myriad of patterns, contact pads, die pads, wire bonds, terminals, and their combinations, as contemplated in various embodiments of the invention. Moreover, the description and illustrations above provide many examples of several embodiments, including various manufacturing stages, such as, for example, leadframe conception and design, leadframe (die and contact pad) fabrication, wire bonding, encapsulation, connecting bar removal and or contact pad isolation, and singulation, in accordance with the invention.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A semiconductor package comprising:
   a lead frame including a plurality of contact pads;
   a removable connecting bar between a first contact pad and a second contact pad among the plurality of contact pads;
   a die pad having a top portion and a bottom portion, wherein a thickness of the top portion is uniform and a thickness of the bottom portion is non-uniform;
   a semiconductor die mounted on the die pad;
   a wire bond coupling the semiconductor die to the first contact pad; and
   an encapsulation encapsulating the semiconductor die, the first contact pad, and the wire bond, wherein a bottom surface of the encapsulation is coplanar with a bottom surface of the uniform portion of the die pad.

2. The semiconductor package of claim 1, wherein the connecting bar is configured for removal based on a selected pattern for the semiconductor package, wherein a means for removal of the connecting bar is selected from a plurality of means for removal based on the selected pattern.

3. The semiconductor package of claim 2, wherein a lower surface of the connecting bar is coplanar with a lower surface of the die pad and an upper surface of the connecting bar is recessed with respect to an upper surface of the die pad.

4. The semiconductor package of claim 2, wherein the semiconductor die is mounted on the die pad by using an adhesive epoxy.

5. The semiconductor package of claim 1, wherein the semiconductor package is manufactured by selecting a pre-tape process based on the connecting bar, wherein the pre-tape process comprises an adhesive tape.

6. The semiconductor package of claim 1, wherein the semiconductor package is manufactured by selecting a no pre-tape process based on the connecting bar, wherein the no pre-tape process comprises an vacuum tape.

7. The semiconductor package of claim 1, wherein the leadframe comprises:
 a partially etched top surface of a metal sheet to form upper surfaces of the plurality of contact pads;
 a masked bottom surface of the metal sheet, such that the areas for the plurality of contact pads are covered;
 an etch bottom surface of the metal sheet, such that lower surfaces of the plurality of contact pads are formed,
 wherein the etched top and bottom surfaces of the metal sheet forms the connecting bar.

8. The semiconductor package of claim 1, wherein the connecting bar is formed by using a cupric chloride type chemical etchant.

9. The semiconductor package of claim 1, wherein the connecting bar is removed by at least one of a chemical etchant, a blade saw, and a laser.

10. The semiconductor package of claim 1, wherein the connecting bar is removed by using an ammonium-type chemical etchant.

11. The semiconductor package of claim 1, wherein the connecting bar electrically couples the first contact pad and the second contact pad.

12. The semiconductor package of claim 1, wherein the connecting bar is exposed to a location outside the package.

13. The semiconductor package of claim 1, wherein a lower surface of the connecting bar is coplanar with a lower surface of the first contact pad and an upper surface of the connecting bar is recessed with respect to an upper surface of the first contact pad.

14. The semiconductor package of claim 1, wherein the semiconductor package further comprise solder balls.

15. The semiconductor package of claim 1, wherein the encapsulation comprises a polymer molding.

16. The semiconductor package of claim 1, wherein the semiconductor package is singulated from a sheet of semiconductor packages.

* * * * *